United States Patent
Na et al.

(10) Patent No.: US 10,971,649 B2
(45) Date of Patent: Apr. 6, 2021

(54) SEMICONDUCTOR DEVICE AND LIGHT EMITTING DEVICE PACKAGE COMPRISING SAME

(71) Applicant: LG INNOTEK CO., LTD., Seoul (KR)

(72) Inventors: Jong Ho Na, Seoul (KR); Oh Min Kwon, Seoul (KR); June O Song, Seoul (KR); Jeong Tak Oh, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/475,895

(22) PCT Filed: Jan. 4, 2018

(86) PCT No.: PCT/KR2018/000186
§ 371 (c)(1),
(2) Date: Jul. 3, 2019

(87) PCT Pub. No.: WO2018/128419
PCT Pub. Date: Jul. 12, 2018

(65) Prior Publication Data
US 2019/0348567 A1 Nov. 14, 2019

(30) Foreign Application Priority Data

Jan. 4, 2017 (KR) .................. 10-2017-0001461
Jan. 5, 2017 (KR) .................. 10-2017-0001904

(51) Int. Cl.
*H01L 33/04* (2010.01)
*H01L 27/12* (2006.01)
*H01L 33/62* (2010.01)

(52) U.S. Cl.
CPC .......... *H01L 33/04* (2013.01); *H01L 27/1222* (2013.01); *H01L 33/62* (2013.01)

(58) Field of Classification Search
CPC .......... H01L 33/025; H01L 2224/4805; H01L 33/0062; H01L 33/325
See application file for complete search history.

(56) References Cited

U.S. PATENT DOCUMENTS 10,333,027 B2   6/2019  Kim
2009/0014713 A1* 1/2009  Kang ................ H01L 33/24
                                                257/13

(Continued)

FOREIGN PATENT DOCUMENTS

KR   10-2012-0118027    10/2012
KR   10-2013-0068701     6/2013

(Continued)

OTHER PUBLICATIONS

International Search Report dated Apr. 26, 2018 issued in Application No. PCT/KR2018/000186.

(Continued)

*Primary Examiner* — Changhyun Yi
(74) *Attorney, Agent, or Firm* — KED & Associates LLP

(57) ABSTRACT

An embodiment relates to a semiconductor device and a light emitting device package including the same. The semiconductor device according to the embodiment may include: a first semiconductor layer; a second semiconductor layer disposed on the first semiconductor layer and including V-pits; an active layer disposed on the second semiconductor layer; a third semiconductor layer having a bandgap wider than that of the active layer on the active layer; a fourth semiconductor layer having a band gap narrower than that of third semiconductor layer on the third semiconductor layer; and a fifth semiconductor layer having a bandgap wider than that of the fourth semiconductor layer on the fourth semiconductor layer, wherein the third semiconductor layer and the fifth semiconductor layer include an aluminum compo- (Continued)

sition, and the fifth semiconductor layer has a bandgap equal to or wider than that of the third semiconductor layer.

7 Claims, 18 Drawing Sheets

(56) References Cited

U.S. PATENT DOCUMENTS

| | | |
|---|---|---|
| 2012/0319126 A1 | 12/2012 | Butendeich et al. |
| 2013/0082236 A1 | 4/2013 | Ramer et al. |
| 2013/0082273 A1 | 4/2013 | Ting |
| 2015/0083993 A1* | 3/2015 | Nagata .................. H01L 33/32 257/13 |
| 2015/0221826 A1 | 8/2015 | Yang et al. |
| 2016/0380155 A1 | 12/2016 | Jeong |
| 2017/0062680 A1* | 3/2017 | Yoo ........................ H01L 33/32 |
| 2018/0261724 A1* | 9/2018 | Park ................... H01L 33/0075 |
| 2020/0119228 A1* | 4/2020 | Lehnhardt .............. H01L 33/18 |

FOREIGN PATENT DOCUMENTS

| | | |
|---|---|---|
| KR | 10-2014-0010064 | 1/2014 |
| KR | 10-2014-0094807 | 7/2014 |
| KR | 10-2015-0065411 | 6/2015 |
| KR | 10-2015-0065412 | 6/2015 |
| KR | 10-2015-0092415 | 8/2015 |
| KR | 10-2015-0140972 | 12/2015 |
| KR | 10-2016-0121837 | 10/2016 |
| KR | 10-2016-0137181 | 11/2016 |
| WO | WO 2013/049416 | 4/2013 |

OTHER PUBLICATIONS

European Search Report dated May 27, 2020 issued in Application No. 18736254.6.

* cited by examiner

[FIG. 1]
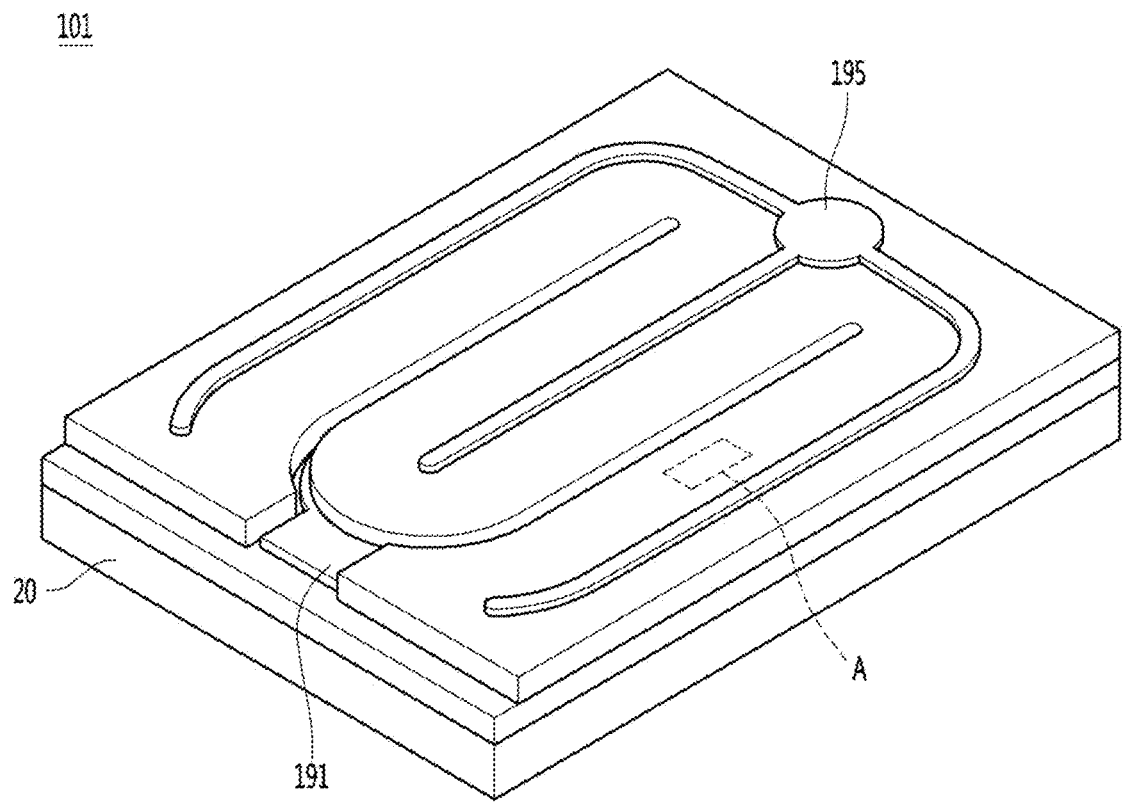
[FIG. 2]
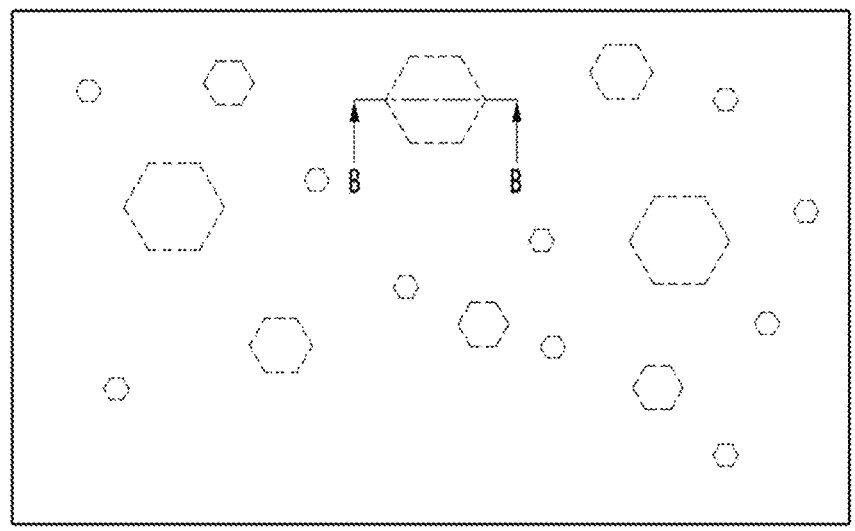

[FIG. 3]
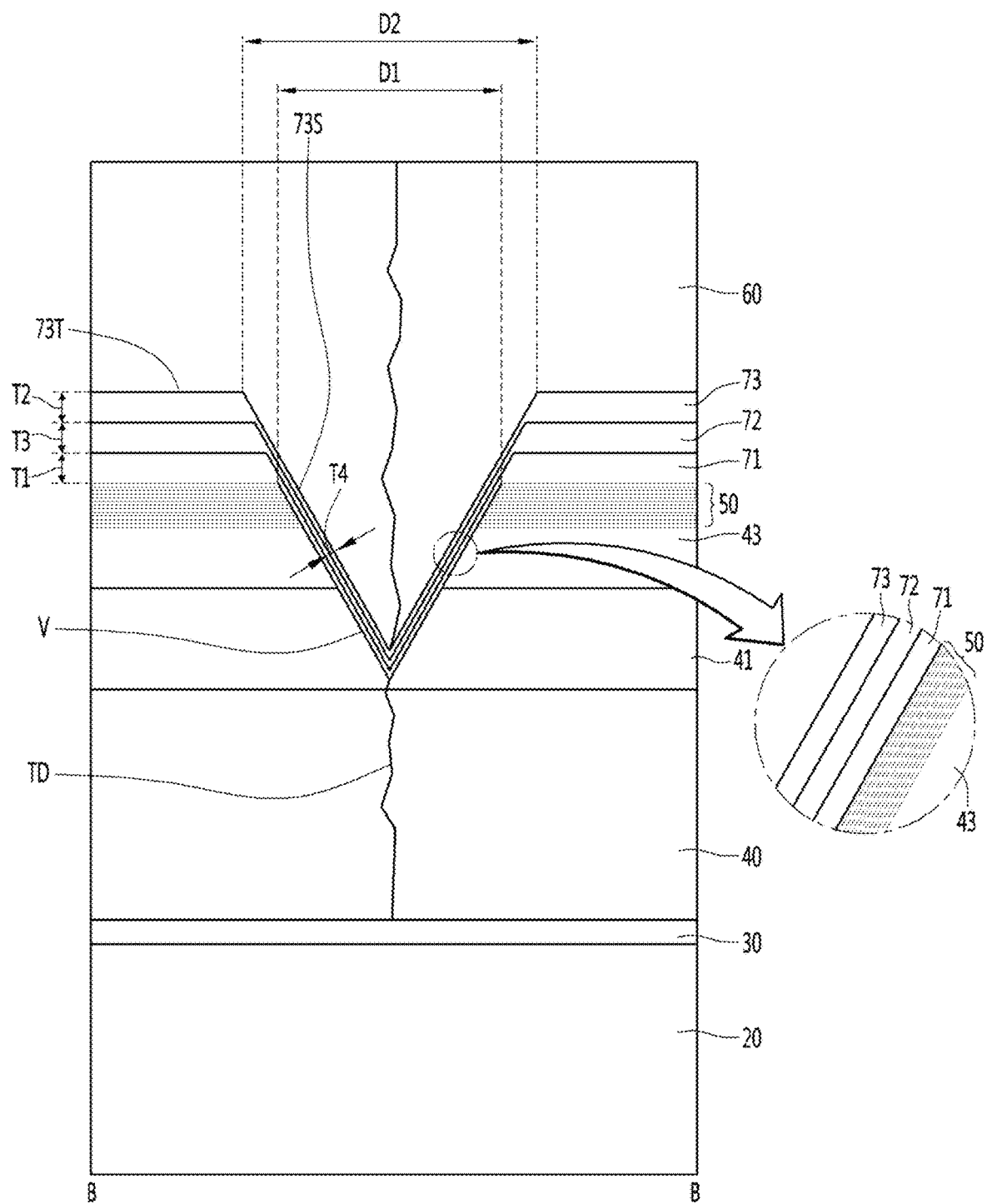

[FIG. 4]
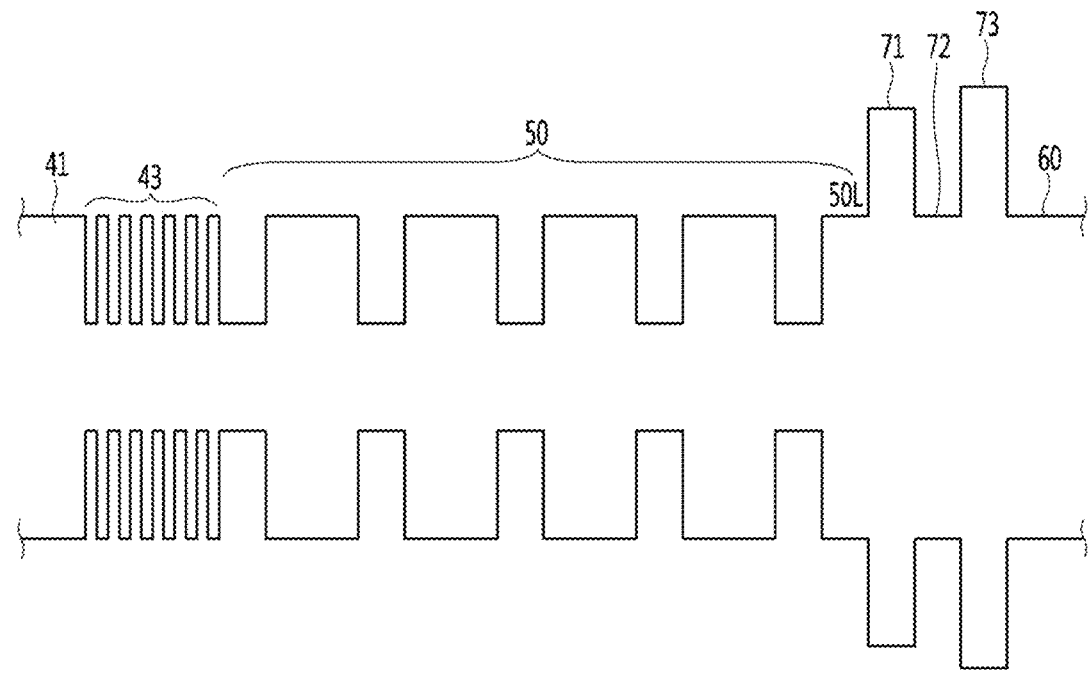
[FIG. 5]
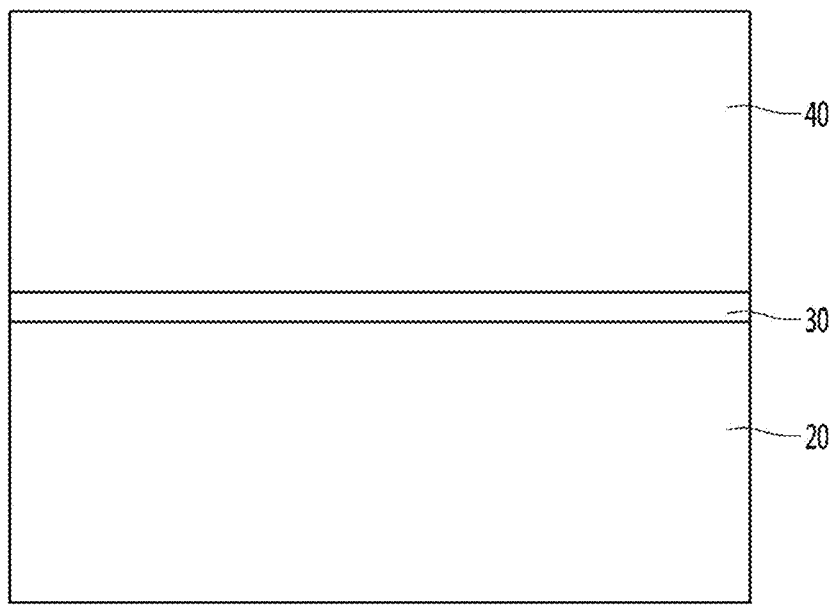

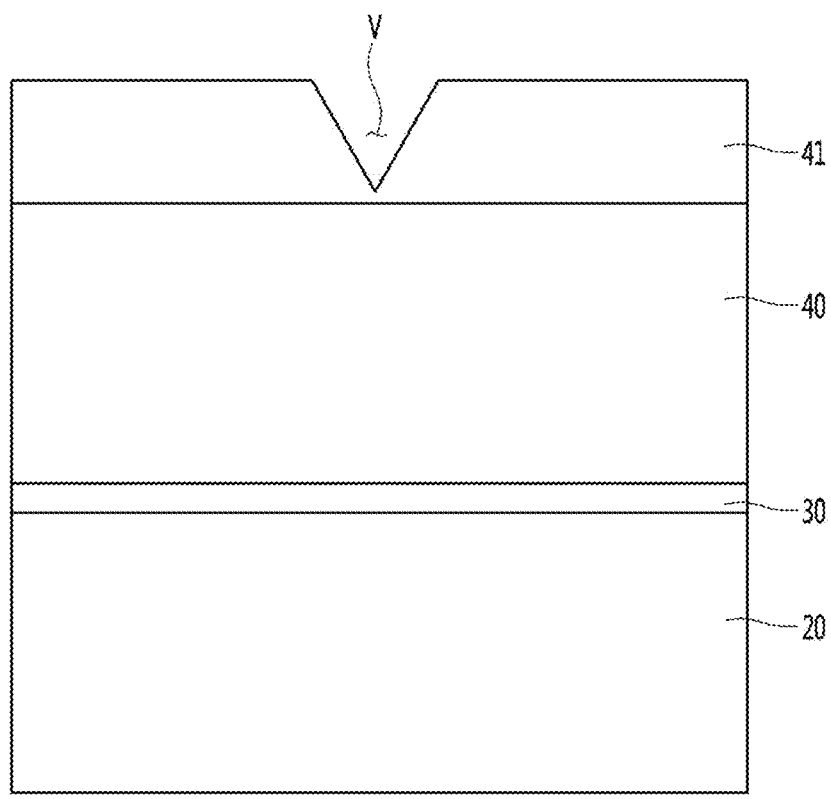
[FIG. 6]

[FIG. 7]
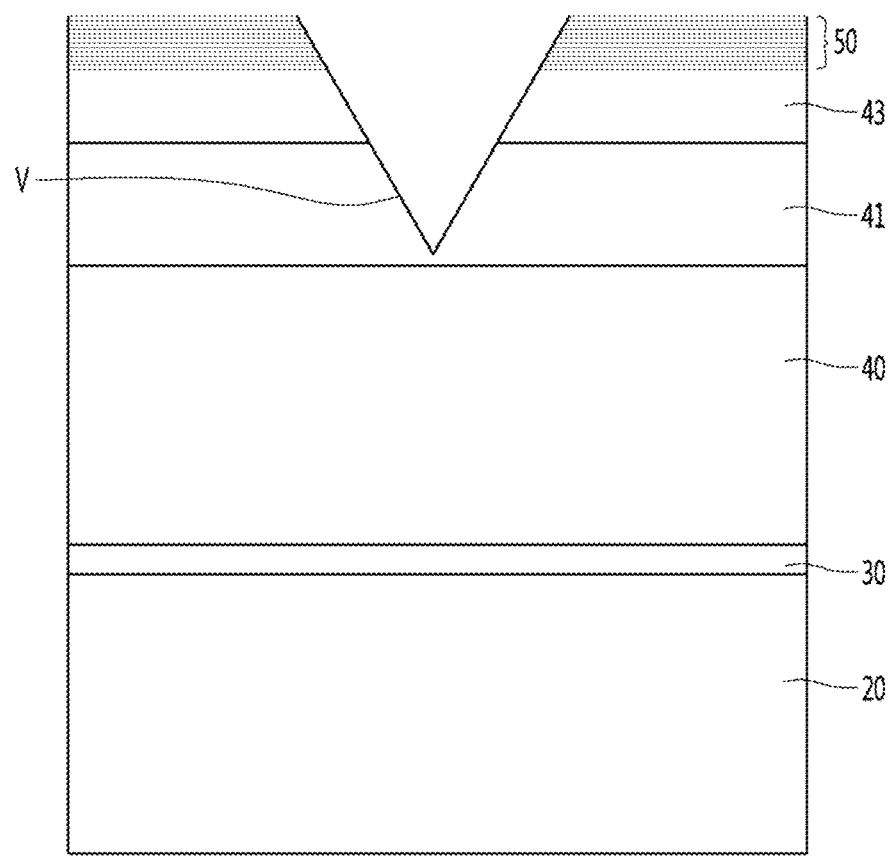

[FIG. 8]
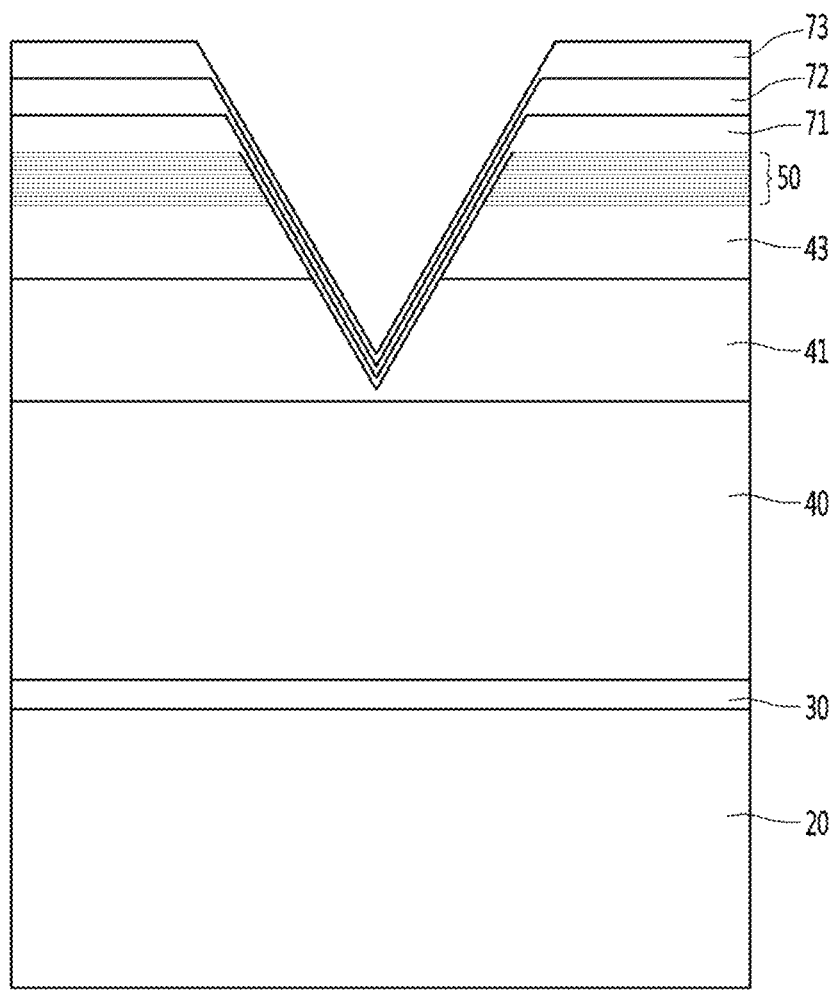

[FIG. 9]
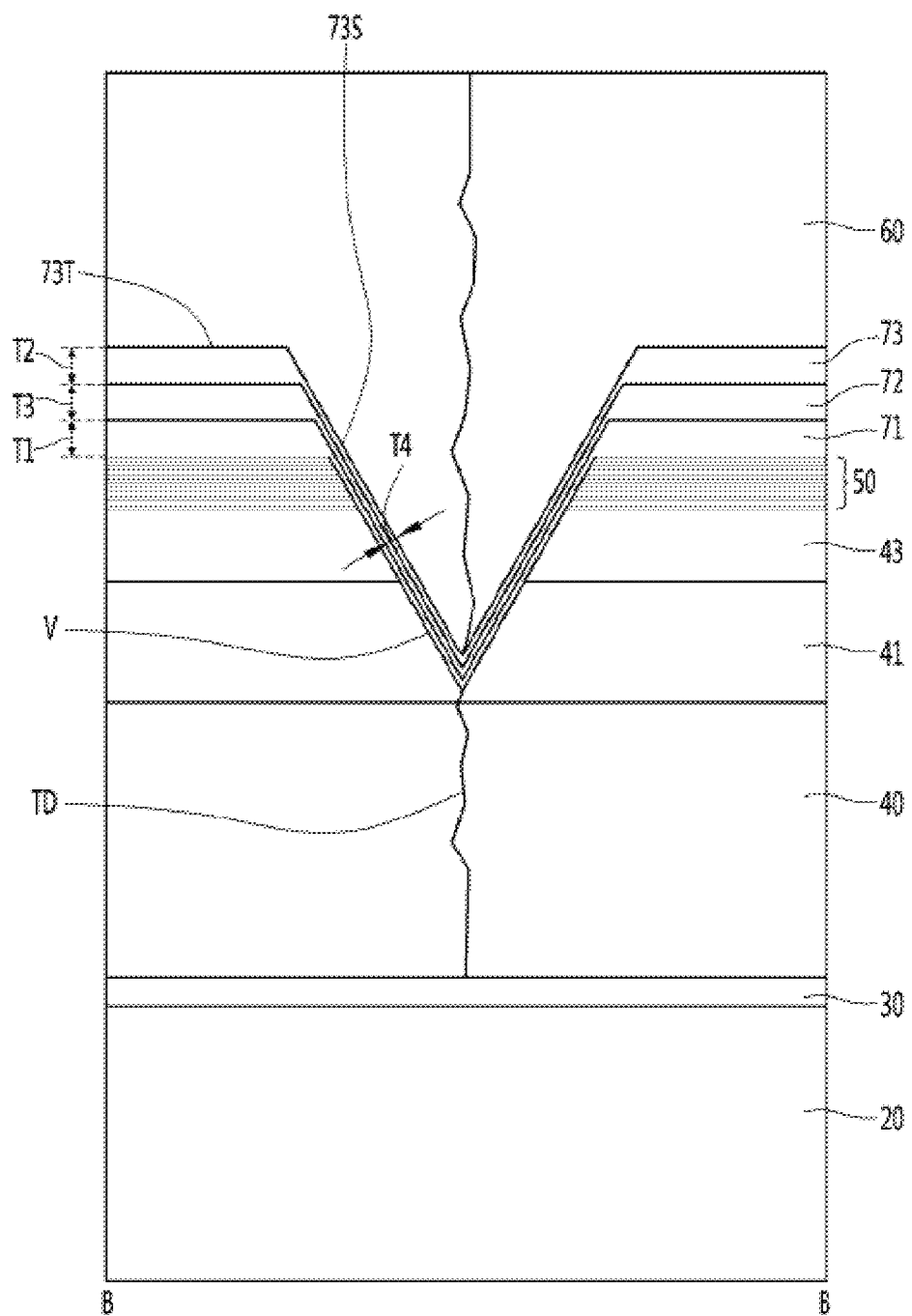

[FIG. 10]
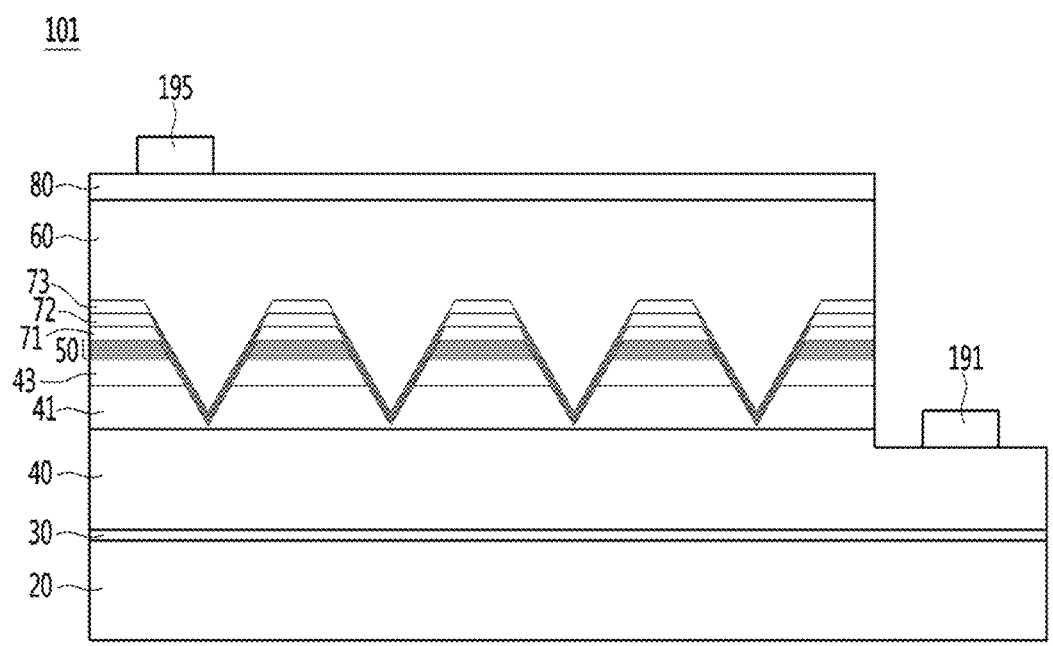

[FIG. 11]
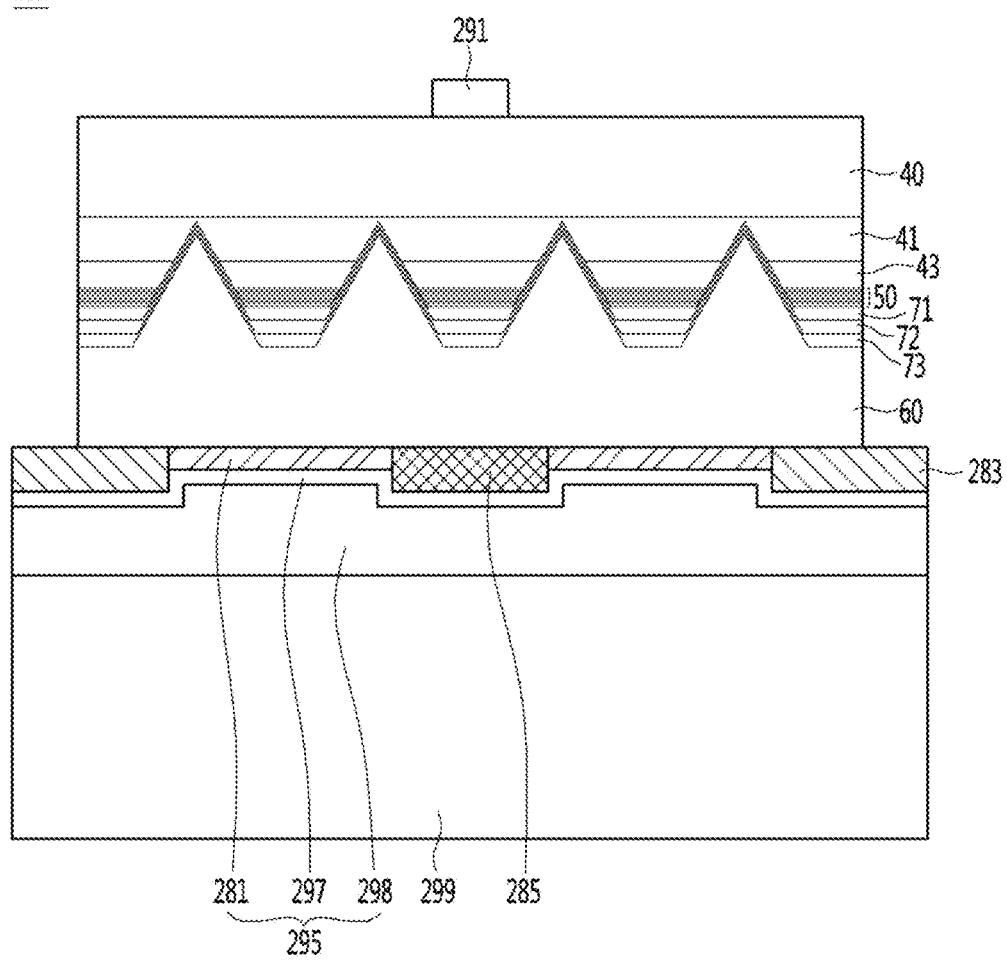

[FIG. 12]
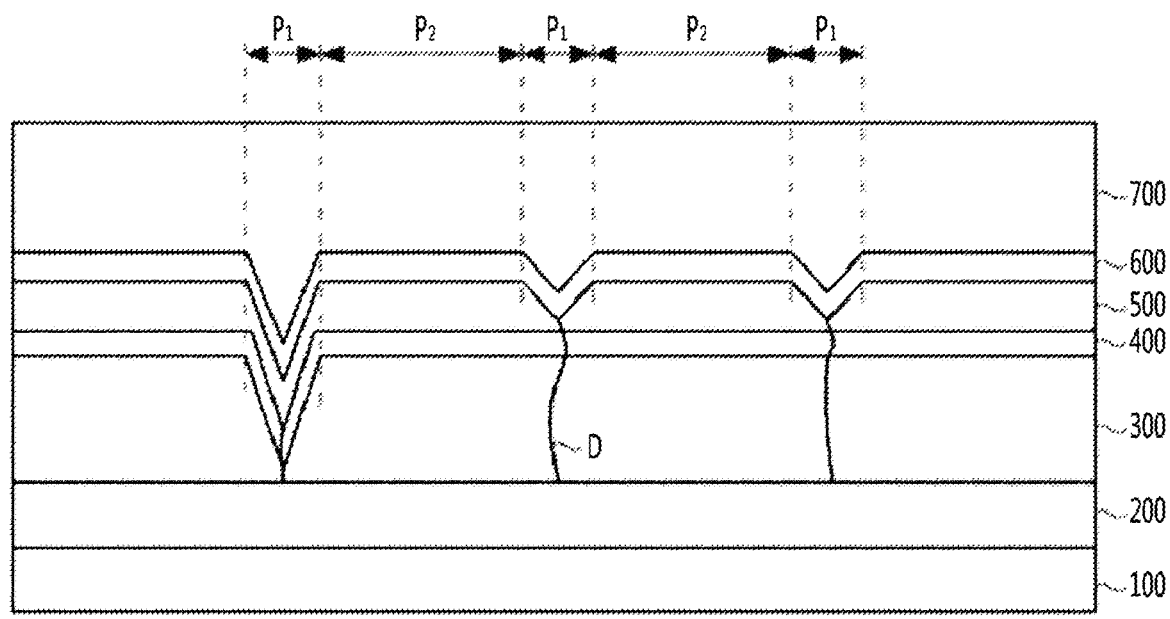
[FIG. 13]
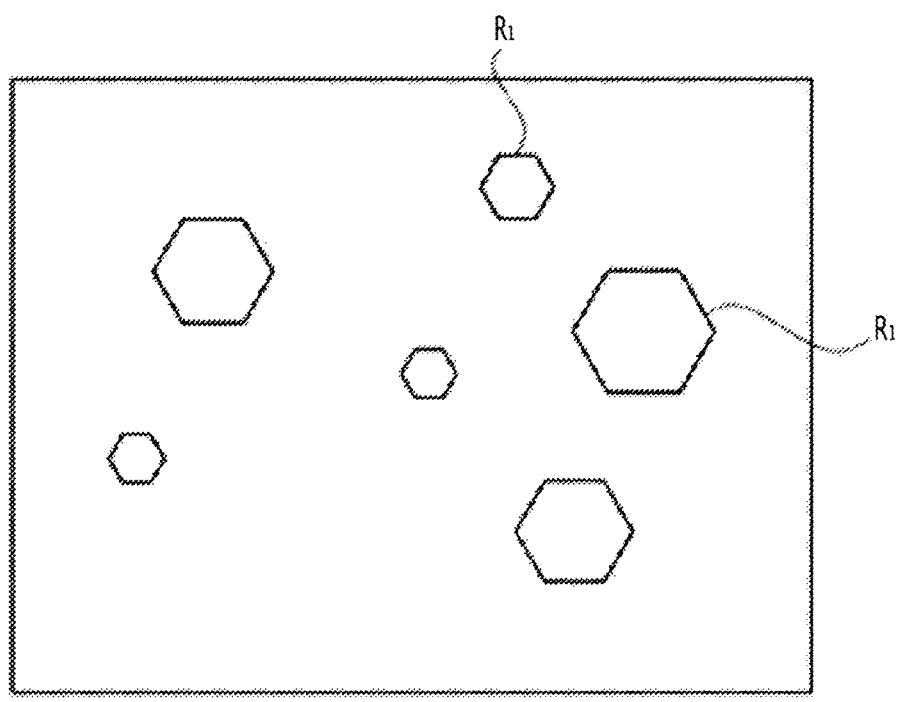

[FIG. 14]
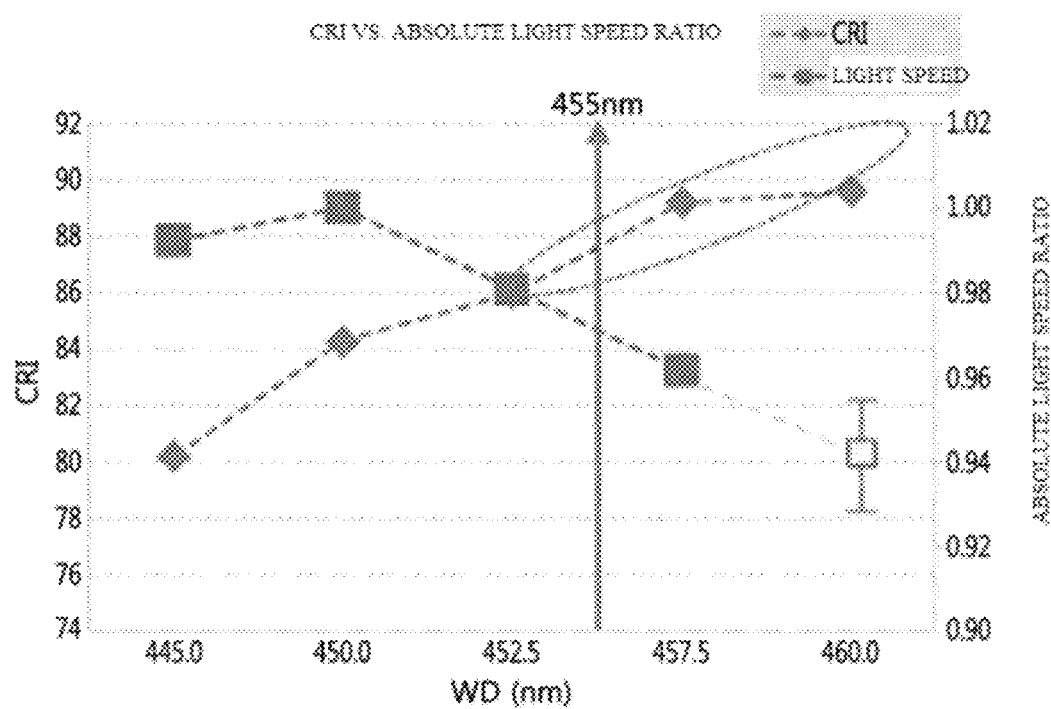

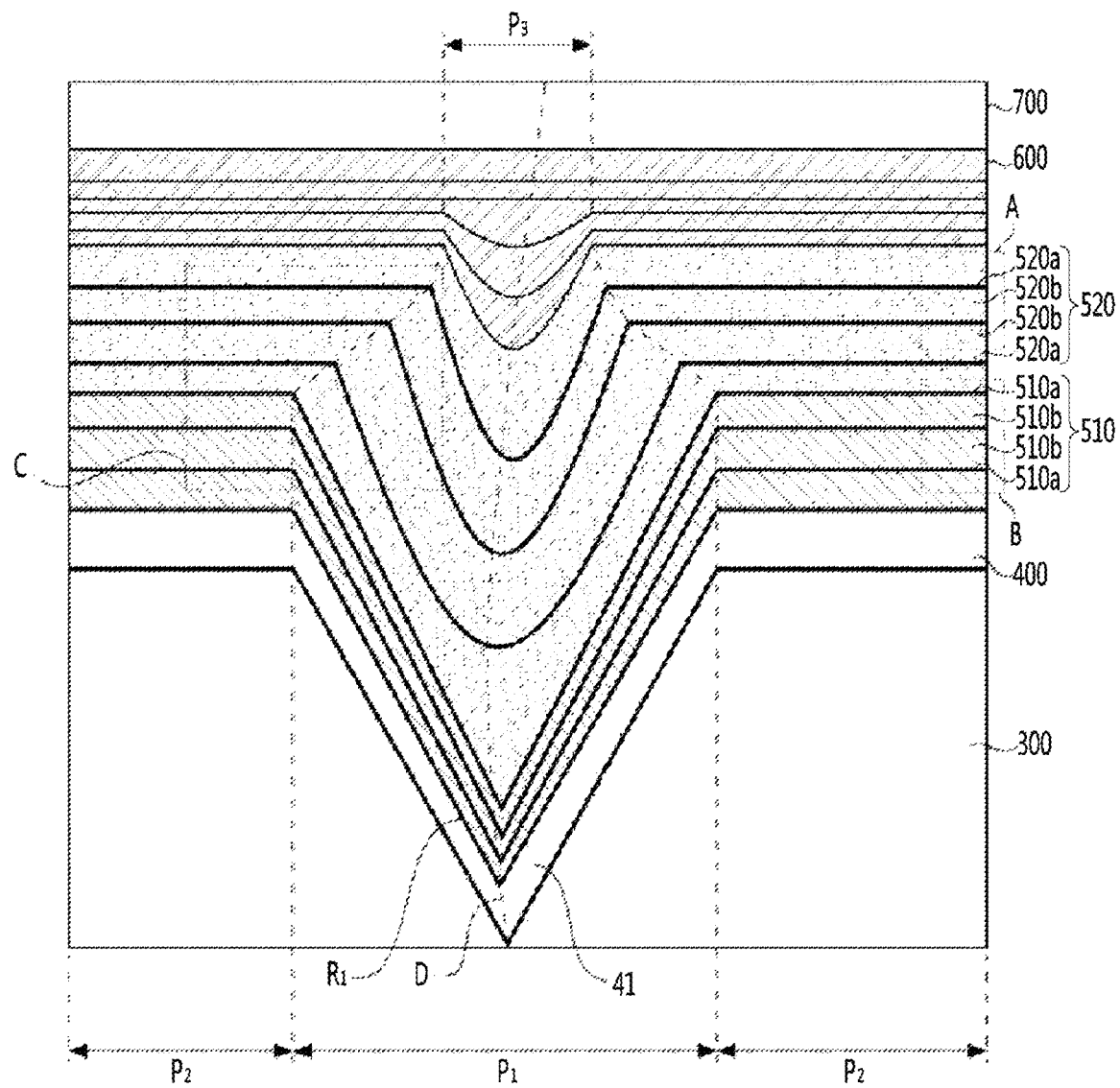
[FIG. 15]

[FIG. 16]
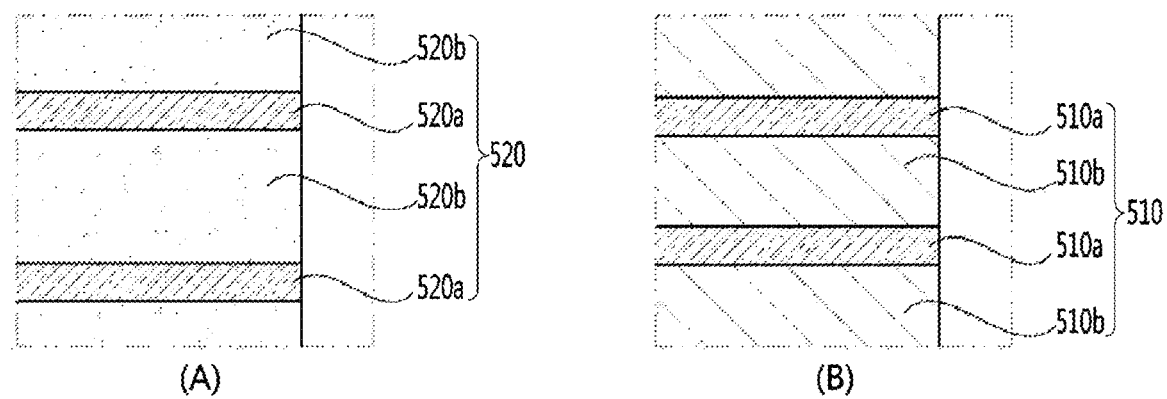
[FIG. 17]
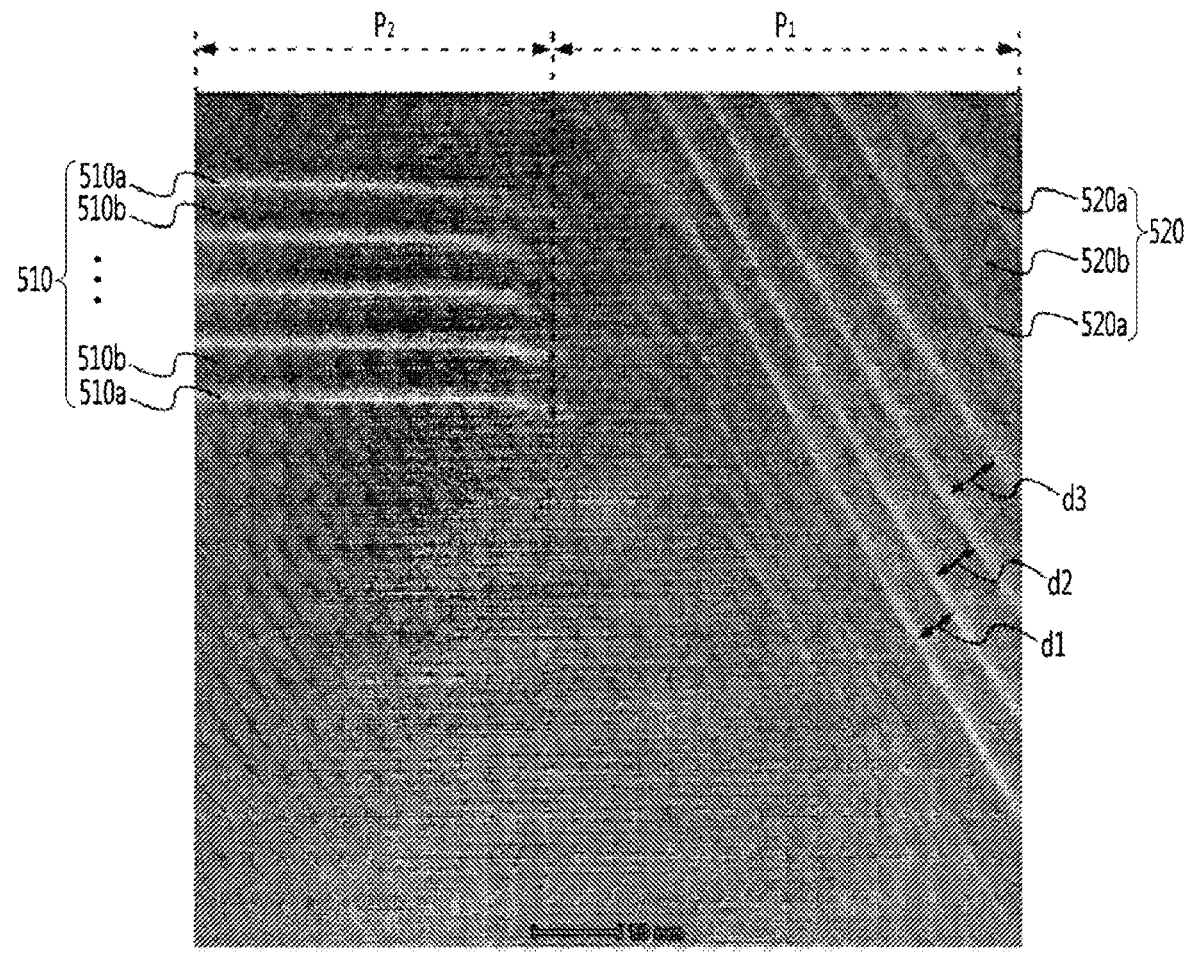

[FIG. 18]
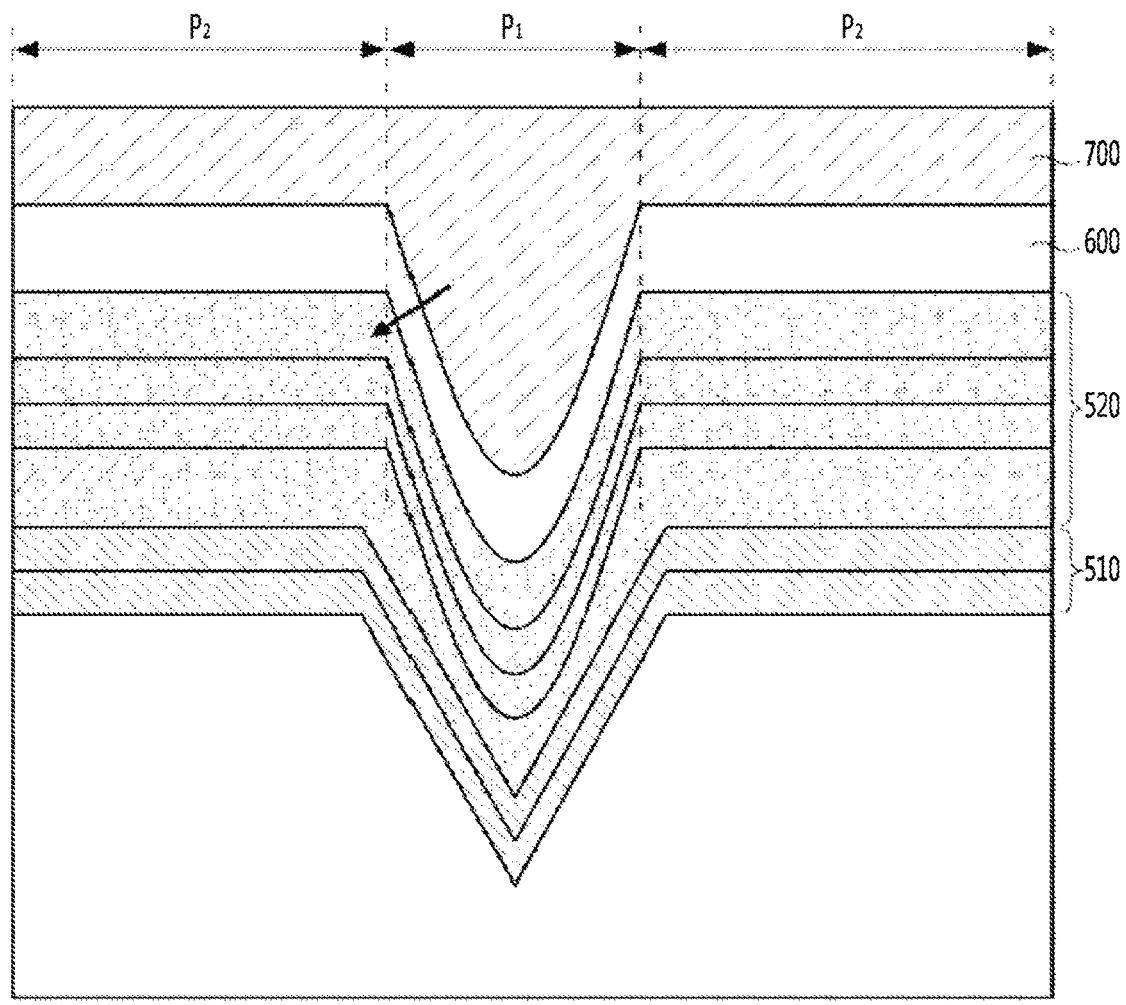

[FIG. 19]
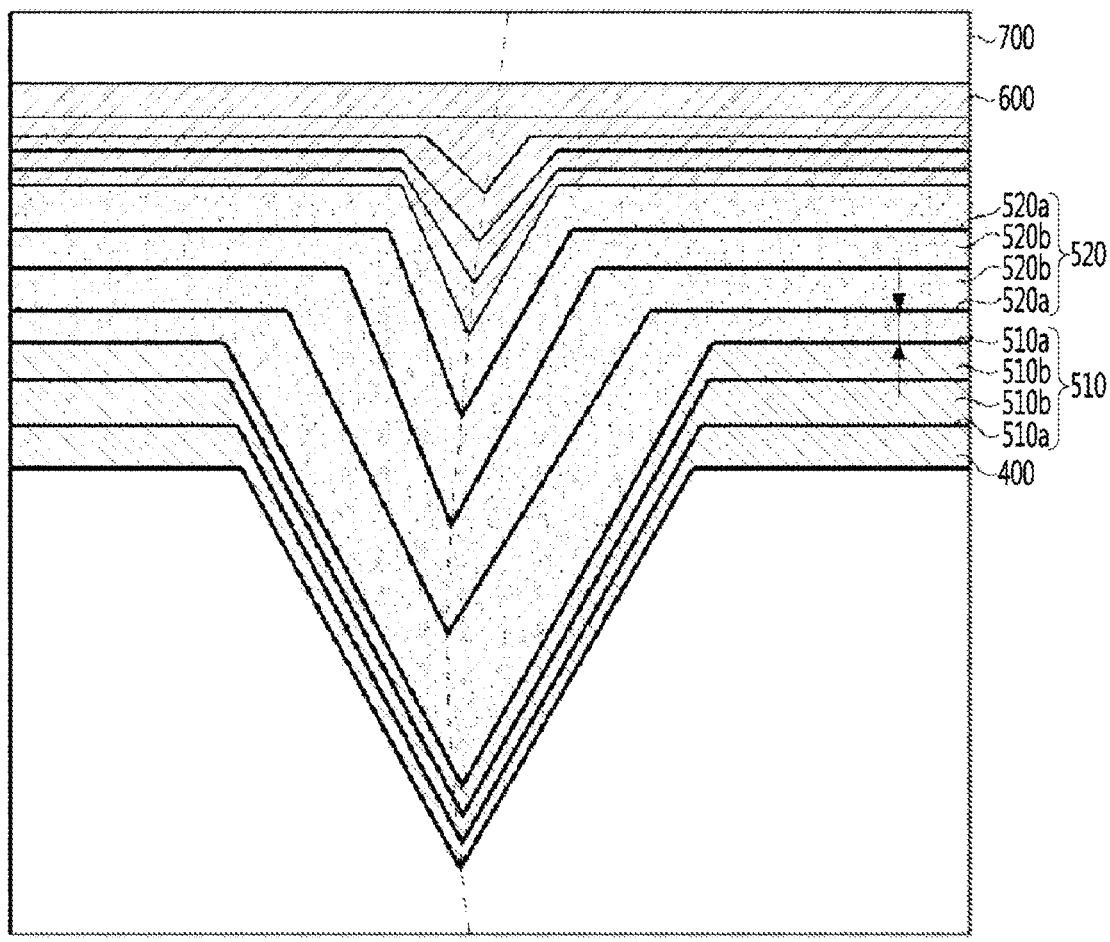

[FIG. 20]
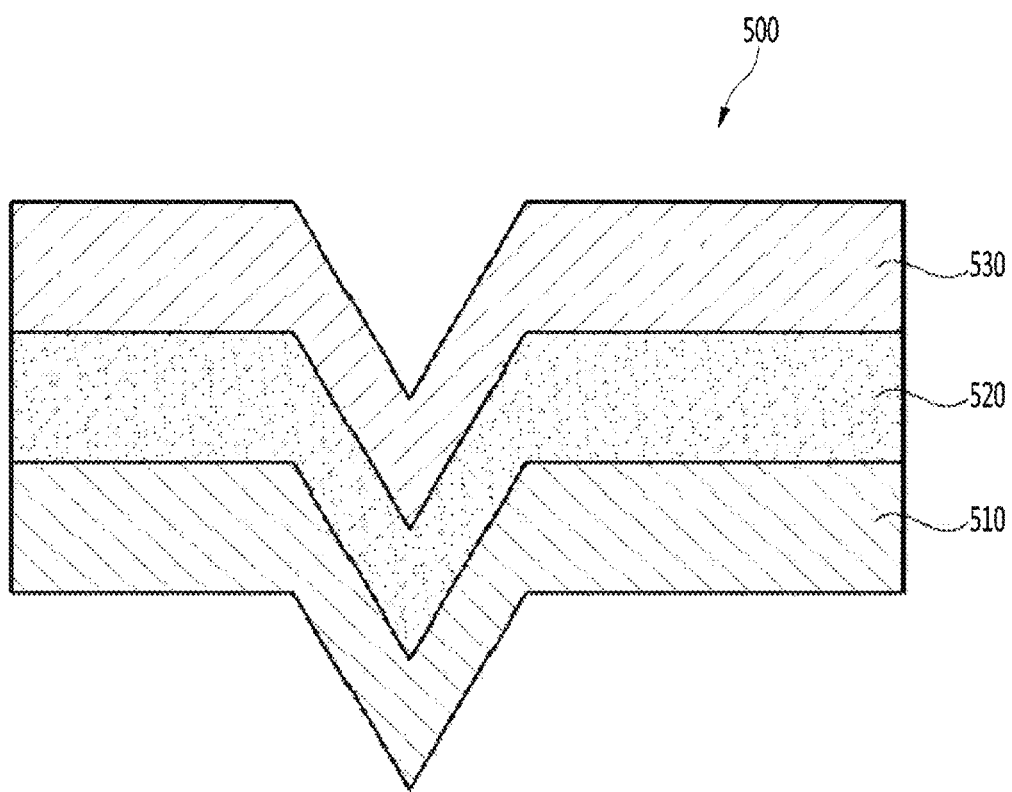

[FIG. 21]
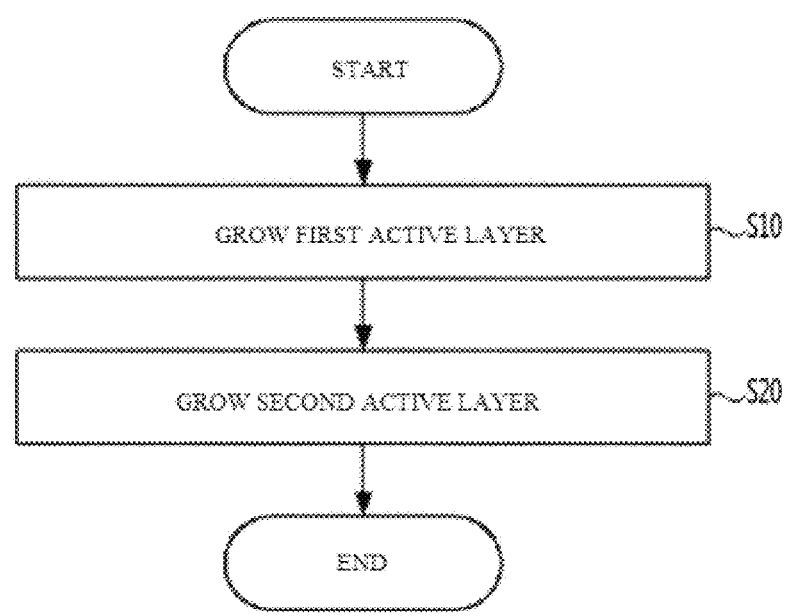

[FIG. 22]
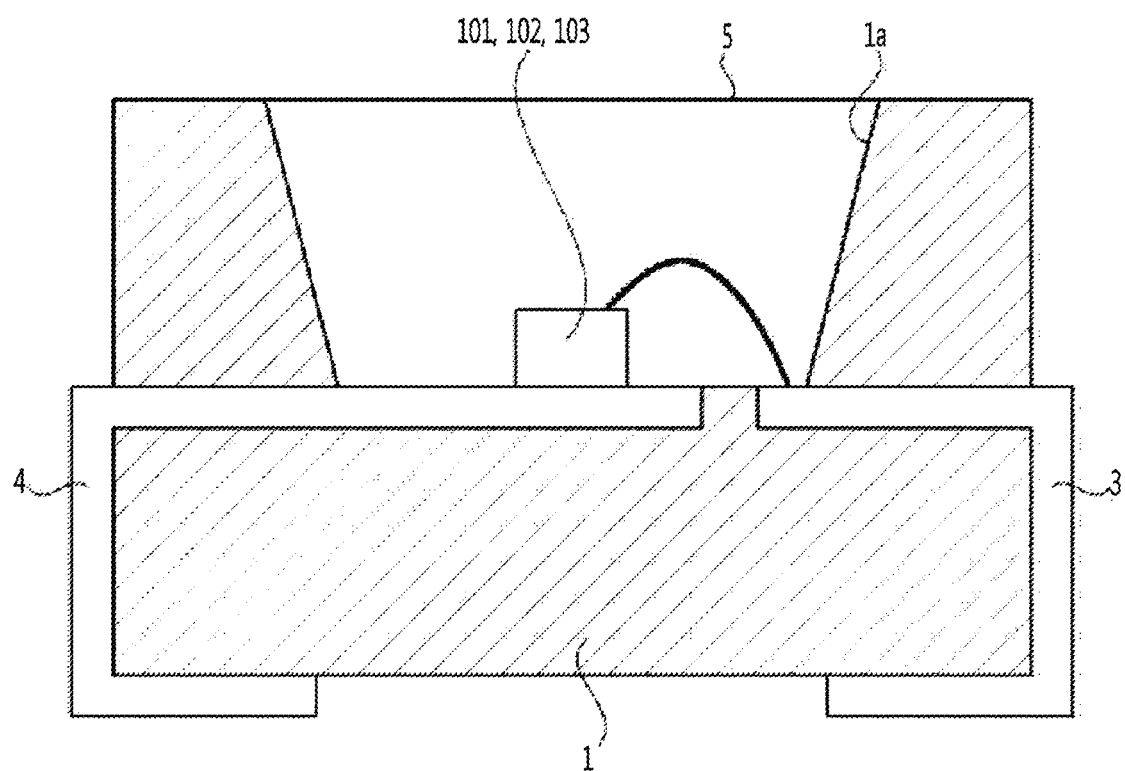

SEMICONDUCTOR DEVICE AND LIGHT EMITTING DEVICE PACKAGE COMPRISING SAME

CROSS-REFERENCE TO RELATED PATENT APPLICATIONS

This application is a U.S. National Stage Application under 35 U.S.C. § 371 of PCT Application No. PCT/KR2018/000186, filed Jan. 4, 2018, which claims priority to Korean Patent Application No's. 10-2017-0001461, filed Jan. 4, 2017 and 10-2017-0001904, filed Jan. 5, 2017, whose entire disclosures are hereby incorporated by reference.

TECHNICAL FIELD

Embodiments relate to a semiconductor device and a semiconductor device package including the same.

BACKGROUND ART

Since semiconductor devices including compounds such as GaN and AlGaN have many merits such as wide and easily adjustable bandgap energy, the semiconductor devices may be variously used as light emitting devices, light receiving devices, and various diodes.

Particularly, light emitting devices, such as a light emitting diode or a laser diode using a group III-V compound semiconductor material or a group II-VI compound semiconductor material, may realize various colors such as a red color, a green color, a blue color, and ultraviolet rays through the development of thin film growth technology and device materials, may realize a white light beam having high efficiency by using a fluorescent material or combining colors, may have advantages such as low power consumption, semi-permanent lifetime, quick response time, safety, and environment friendliness, as compared to conventional light sources such as fluorescent lamps and incandescent lamps.

In addition, when a light receiving device such as a photodetector or a solar cell is manufactured by using a group III-V compound semiconductor material or a group II-VI compound semiconductor material, device materials may be developed to use light of various wavelength ranges to generate photocurrent. Therefore, tight of various wavelength ranges from gamma rays to radio wavelength ranges may be used. In addition, due to advantages of fast response time, safety, environmental friendliness, and easy control of device materials, it may be easily used for power control, microwave circuit, or communication module.

Therefore, the application of semiconductor devices expands to transmission modules of optical communication means, light emitting diode backlights replacing a cold cathode fluorescent lamp (CCFL) constituting a backlight of a liquid crystal display (LCD) device, white light emitting diode lighting devices capable of replacing fluorescent lamps or incandescent lamps, car headlights, traffic lights, and gas or fire sensors. In addition, the application of semiconductor devices may expand to high frequency application circuits, other power control devices, and communication modules.

DISCLOSURE OF THE INVENTION

Technical Problem

Embodiments may provide a semiconductor device capable of improving carrier injection efficiency, and a light emitting device package including the same.

Embodiments may provide a semiconductor device capable of increasing hole injection efficiency and improving current spreading, and a light emitting device package including the same.

Embodiments may increase hole injection efficiency due to 2DHG effect and may increase the injection of carriers injected through V-pits, thereby improving the luminous efficiency.

Embodiments may provide a semiconductor device capable of improving a color rendering index.

Embodiments may provide a semiconductor device capable of improving light output.

Embodiments may provide a semiconductor device capable of lowering a driving voltage.

Technical Solution

A semiconductor device according to an embodiment includes: a first semiconductor layer; a second semiconductor layer disposed on the first semiconductor layer and including V-pits; an active layer disposed on the second semiconductor layer; a third semiconductor layer having a bandgap wider than that of the active layer on the active layer; a fourth semiconductor layer disposed on the third semiconductor layer; and a fifth semiconductor layer having a bandgap wider than that of the fourth semiconductor layer on the fourth semiconductor layer, wherein the third semiconductor layer and the fifth semiconductor layer include an aluminum composition, and the fifth semiconductor layer has a bandgap equal to or wider than that of the third semiconductor layer.

A semiconductor device according to an embodiment includes: a first conductive semiconductor layer; an active layer disposed on the first-conductivity-type semiconductor layer and including a first active layer and a second active layer disposed on the first active layer; and a second-conductivity-type semiconductor layer disposed on the active layer, wherein the active layer includes a first region including a plurality of recesses and a second region disposed between the recesses, and a thickness of the first region of the first active layer is smaller than a thickness of the second region of the first active layer.

Advantageous Effects

Embodiments may improve carrier injection efficiency through V-pits.

Embodiments may increase hole injection efficiency and improve current spreading.

Embodiments may improve carrier injection efficiency and reduce an operating voltage to realize low voltage driving.

Embodiments may increase hole injection efficiency due to 2DHG effect and may increase the injection of carriers injected through V-pits, thereby improving the luminous efficiency.

Embodiments may improve a color rendering index of a light emitting device.

Embodiments may improve light output of a light emitting device and lower a driving voltage.

BRIEF DESCRIPTION OF THE DRAWINGS

FIG. 1 is a plan view illustrating a semiconductor device according to an embodiment.

FIG. 2 is a view illustrating a portion A in FIG. 1.

FIG. 3 is a cross-sectional view illustrating the semiconductor device, taken along line B-B in FIG. 2.

FIG. 4 is a view illustrating an energy band diagram of the semiconductor device according to an embodiment.

FIGS. 5 to 9 are views illustrating a method of manufacturing a semiconductor device according to an embodiment.

FIG. 10 is a view illustrating a horizontal type semiconductor device including an electrode.

FIG. 11 is a view illustrating a vertical type semiconductor device including an electrode.

FIG. 12 is a conceptual view of a light emitting structure according to another embodiment of the present invention.

FIG. 13 is a plan view illustrating recesses having various sizes according to another embodiment of the present invention.

FIG. 14 is a graph illustrating a relationship between a color rendering index and light output.

FIG. 15 is a partial cross-sectional view of a light emitting structure according to another embodiment of the present invention.

FIG. 16 is an enlarged view of a portion A and a portion B in FIG. 4.

FIG. 17 is a view illustrating a cross section of a semiconductor device according to another embodiment of the present invention.

FIG. 18 is a partial cross-sectional view of a semiconductor device according to another embodiment of the present invention.

FIG. 19 is a partial cross-sectional view of a semiconductor device according to further another embodiment of the present invention.

FIG. 20 is a partial cross-sectional view of a semiconductor device according to further another embodiment of the present invention.

FIG. 21 is a flowchart for describing a method of manufacturing a semiconductor device according to another embodiment of the present invention.

FIG. 22 is a conceptual view of a semiconductor device package according to an embodiment of the present invention.

BEST MODE

Embodiments may be modified in other forms, or various embodiments may be combined with each other. The scope of the present invention is not limited to the following embodiments described below.

Although the matters described in a specific embodiment are not described in another embodiment, it may be understood as the description related to another embodiment, unless otherwise stated or contradicted in another embodiment.

For example, when the features for configuration A are described in a particular embodiment and the features for configuration B are described in another embodiment, although embodiments in which configuration A and configuration B are combined are not explicitly described, it will be understood as falling within the scope of the present invention, unless otherwise stated or contradictory.

Hereinafter, embodiments of the present invention, which can specifically realize the above objects, will be described with reference to the accompanying drawings.

In the description of embodiments according to the present invention, it will be understood that when an element is referred to as being "on" or "under" another element, it may be directly formed on or under another element, and one or more intervening elements may be indirectly formed between the two elements. Also, when expressed as "on" or "under", it may include not only an upward direction but also a downward direction with respect to one element.

An electric device may include various electronic devices such as a light emitting device, a light receiving device, an optical modulator, and a gas sensor. Although an embodiment describes a gas sensor by way of example, the present invention is not limited thereto and can be applied to various fields of electric devices.

FIG. 1 is a plan view illustrating a semiconductor device according to an embodiment.

FIG. 2 is a view illustrating a portion A in FIG. 1.

FIG. 3 is a cross-sectional view illustrating the semiconductor device, taken along line B-B in FIG. 2.

FIG. 4 is a view illustrating an energy band diagram of the semiconductor device according to an embodiment.

As illustrated in FIGS. 1 to 4, a semiconductor device 101 according to an embodiment is described as an example of a light emitting device that emits light having a predetermined wavelength, but the present invention is not limited thereto.

One object of the embodiment is to improve carrier injection efficiency through V-pits V formed through treading dislocation (TD). In addition, one object of the embodiment is to reduce carrier injection in a vertical direction, increase carrier injection through the V-pits V, and improve luminous efficiency. To this end, the embodiment may include third to fifth semiconductor layers 71, 72, and 73 capable of improving V-pits (V) carrier injection on an active layer 50.

The semiconductor device 101 of the embodiment may include a first semiconductor layer 40, a second semiconductor layer 41, a third semiconductor layer 71, a fourth semiconductor layer 72, a fifth semiconductor layer 73, an active layer 50, a sixth semiconductor layer 60, a seventh semiconductor layer 43, a first electrode 191, and a second electrode 195.

The semiconductor device 101 may include a substrate 20 under the first semiconductor layer 40, or may include the substrate 20 and a buffer layer 30 under the first semiconductor layer 40.

The substrate 20 may be, for example, a light-transmitting substrate, a conductive substrate, or an insulating substrate. For example, the substrate 20 may include at least one of sapphire (Al2O3), SiC, Si, GaAs, GaN, ZnO, GaP, InP, Ge, and Ga2O3. A plurality of protrusions (not illustrated) may be formed on an upper surface and/or a lower surface of the substrate 20. A side cross-section of each of the plurality of protrusions may have a hemispherical shape, a polygonal shape, and an oval shape. The plurality of protrusions may be arranged in a stripe form or a matrix form. The protrusions may improve light extraction efficiency.

The buffer layer 30 may be disposed between the substrate 20 and the first semiconductor layer 40. The buffer layer 30 may be formed with at least one layer by using group III-V compound semiconductors or group II-VI compound semiconductors. The buffer layer 30 may be made of, for example, a semiconductor material having an empirical formula of InxAlyGa1-x-yN (0≤x≤1, 0≤y≤1, 0≤x+y≤1). The buffer layer 30 may include, for example, at least one of GaN, AlN, AlGaN, InGaN, InN, InAlGaN, AlInN, AlGaAs, GaP, GaAs, GaAsP, AlGaInP, or ZnO.

The buffer layer 30 may be formed to have a super lattice structure by alternately arranging different semiconductor layers. The buffer layer 30 may be disposed so as to reduce a difference in lattice constant between the substrate 20 and a nitride-based semiconductor layer and may be defined as a defect control layer. The lattice constant of the buffer layer 30 may have a value between lattice constants of the substrate 20 and the nitride-based semiconductor layer. The buffer layer 30 may not be formed, and the present invention is not limited thereto.

<First Semiconductor Layer>

The first semiconductor layer 40 may be disposed between the substrate 20 and the second semiconductor layer 41. The first semiconductor layer 40 may be made of at least one of group III-V compound semiconductors or group II-VI compound semiconductors. The first semiconductor layer 40 may be made of, for example, a semiconductor material having an empirical formula of InxAlyGa1-x-yN ($0 \leq x \leq 1$, $0 \leq y \leq 1$, $0 \leq x+y \leq 1$). The first semiconductor layer 40 may include, for example, at least one of GaN, AlN, AlGaN, InGaN, InN, InAlGaN, AlInN, AlGaAs, GaP, GaAs, GaAsP, or AlGaInP. The first semiconductor layer 40 may be an n-type semiconductor layer doped with an n-type dopant such as Si, Ge, Sn, Se, and Te.

The first semiconductor layer 40 may be formed with a single layer or a multi-layer. When the first semiconductor layer 40 is a multi-layer, two or three different layers may be alternately repeatedly stacked. For example, two or three different layers may be stacked in a period of at least one of AlGaN/GaN, AlInN/GaN, InGaN/GaN, or AlInGaN/InGaN/GaN. Two or three different layers may be formed in 2 to 30 cycles. The first semiconductor layer 40 may include a super lattice structure.

<Second Semiconductor Layer>

The second semiconductor layer 41 may be disposed on the first semiconductor layer 40. The second semiconductor layer 41 may include V-pits V. The second semiconductor layer 41 may be a layer in which the V-pits V is formed in a treading dislocation (TD) region by a low-temperature growth process. The second semiconductor layer 41 may have a constant thickness so as to control the width of the V-pits V. For example, the thickness of the second semiconductor layer 41 may be 60 nm to 300 nm. Specifically, the thickness of the second semiconductor layer 41 may be 60 nm to 100 nm.

The second semiconductor layer 41 may be made of at least one of group III-V compound semiconductors or group II-VI compound semiconductors. The second semiconductor layer 41 may be made of, for example, a semiconductor material having an empirical formula of InxAlyGa1-x-yN ($0 \leq x \leq 2$, $0 \leq y \leq 1$, $0 \leq x+y \leq 1$). The second semiconductor layer 41 may include, for example, at least one of GaN, AlN, AlGaN, InGaN, InN, InAlGaN, AlInN, AlGaAs, GaP, GaAs, GaAsP, or AlGaInP. The second semiconductor layer 41 may be an n-type semiconductor layer doped with an n-type dopant such as Si, Ge, Sn, Se, and Te. For example, the doping concentration of the n-type dopant of the second semiconductor layer 41 may be 2E17 cm-3 to 1E19 cm-3.

The second semiconductor layer 41 may be formed with a single layer or a multi-layer. When the second semiconductor layer 41 is a multi-layer, two or three different layers may be alternately repeatedly stacked. For example, two or three different layers may be stacked in a period of at least one of AlGaN/GaN, AlInN/GaN, InGaN/GaN, or AlInGaN/InGaN/GaN. Two or three different layers may be formed in 2 to 30 cycles. The second semiconductor layer 41 may include a super lattice structure.

The V-pits V may include a width that gradually increases toward the upper surface of the sixth semiconductor layer 60. For example, the V-pits V may include a first width D1 and a second width D2 that is greater than the first width D1. The first width D1 may be the width of the V-pits V, which is parallel to the upper portion of the active layer 50 in the horizontal direction. The second width D2 may be disposed above the first width D1 and may be the width of the V-pits V that is parallel to the upper portion of the fifth semiconductor layer 73 in the horizontal direction. For example, the V-pits V may include a passivation function to prevent a leakage current from being generated through the treading dislocation (TD) of the semiconductor device 101. For example, the V-pits V may have a second width D2 of 100 nm or more for passivation. Specifically, the first width D1 may be 200 nm to 300 nm, and the second width D2 may be 300 nm to 400 nm. The V-pits V of the embodiment may improve the passivation function by increasing the first width and the second width D2.

When the first width D1 of the V-pits V is less than 100 nm, electrons provided through the V-pits V may generate a leakage current through the treading dislocation (TD). Therefore, when the first width D1 of the V-pits V is less than 100 nm, the passivation function may be degraded.

<Active Layer>

The active layer 50 may be disposed on the second semiconductor layer 41. The active layer 50 of the embodiment may include V-pits V. A first region of the active layer 50 may be disposed on the V-pits V. In addition, a second region of the active layer 50 may be disposed outside the V-pits V. The second region of the active layer 50 may be disposed above the first region and may include a flat surface in a first direction. The first region of the active layer 50 may be thinner than the second region of the active layer 50.

The second region of the active layer 50 may correspond to a C(0001) plane as a polar plane, and the first region may correspond to an R(1102) plane as a semi-polar plane.

The active layer 50 may have at least one of a single well structure, a single quantum well (SQM) structure, a multi well structure, a multi quantum well (MQW) structure, a quantum-wire structure, or a quantum dot structure.

The active layer 50 is a layer in which electrons (or holes) injected through the first semiconductor layer 40 and holes (or electrons) injected through the second semiconductor layer 60 recombine with each other to emit light due to a band gap difference between energy bands according to a forming material of the active layer 50. The active layer 50 may be made of compound semiconductors. The active layer 50 may be made of at least one of group III-V compound semiconductors or group II-VI compound semiconductors. When the active layer 50 is implemented by a multi well structure, the active layer 50 may includes a plurality of well layers and a plurality of barrier layers alternately disposed.

The plurality of well layer may be made of, for example, a semiconductor material having an empirical formula of InxAlyGa1-x-yN ($0 \leq x \leq 1$, $0 \leq y \leq$, $0 \leq x+y \leq 1$). The plurality of barrier layer may be made of, for example, a semiconductor material having an empirical formula of InxAlyGa1-x-yN ($0 \leq x \leq 1$, $0 \leq y \leq$, $0 \leq x+y \leq 1$).

The well layer and the barrier layer each include at least one of pairs of InGaN/GaN, GaN/AlGaN, AlGaN/AlGaN, InGaN/AlGaN, InGaN/InGaN, AlGaAs/GaA, InGaAs/GaAs, InGaP/GaP, AlInGaP/InGaP, and InP/GaAs <Seventh Semiconductor Layer>

The seventh semiconductor layer 43 may be disposed between the active layer 50 and the second semiconductor layer 41. The seventh semiconductor layer 43 may have a super lattice structure including a plurality of pairs. For example, the seventh semiconductor layer 43 may have a structure in which a plurality of pairs of semiconductor layers made of at least two selected from compound semiconductors such as GaN, InN, AlN, InGaN, AlGaN, InAl- GaN, and AlInN are alternately disposed. For example, the seventh semiconductor layer 43 may be InGaN/GaN including a plurality of pairs.

The seventh semiconductor layer 43 having the super lattice structure may include a current spreading function and a stress relaxation function.

Although not illustrated in the drawings, a semiconductor layer having a super lattice structure may be further included between the active layer 50 and the sixth semiconductor layer 60. The semiconductor layer having the super lattice structure may include, for example, a plurality of pairs. For example, the semiconductor layer having the super lattice structure may have a structure in which a plurality of pairs of semiconductor layers made of at least two selected from compound semiconductors such as GaN, InN, AlN, InGaN, AlGaN, InAlGaN, and AlInN are alternately disposed. The semiconductor layer having the super lattice structure may include a current spreading function and a stress relaxation function.

<Third Semiconductor Layer>

The third semiconductor layer 71 may be disposed on the active layer 50. The third semiconductor layer 71 may include an electron blocking function for blocking electrons traveling through the active layer 50. For example, the third semiconductor layer 71 may include, for example, at least one of compound semiconductors, such as GaN, InN, AlN, InGaN, AlGaN, InAlGaN, and AlInN. The third semiconductor layer 71 may include an empirical formula of, for example, $In_xAl_yGa_{1-x-y}N$ ($0 \leq x \leq 1$, $0 \leq y \leq$, $0 \leq x+y \leq 1$). The third semiconductor layer 71 may be made of an AlN-based semiconductor having a bandgap wider than that of the barrier layer of the active layer 50. The AlN-based semiconductor may include at least one selected from AlN, AlGaN, InAlGaN, and AlInN-based semiconductors. The third semiconductor layer 71 may be a p-type semiconductor layer including a p-type dopant such as Mg, Zn, Ca, Sr, and Ba.

The third semiconductor layer 71 may include V-pits V. A first region of the third semiconductor layer 71 may be disposed on the V-pits V. In addition, a second region of the third semiconductor layer 71 may be disposed outside the V-pits V. The second region of the third semiconductor layer 71 may be disposed above the first region of the third semiconductor layer 71 and may include a flat surface in a first direction. The first region of the third semiconductor layer 71 may be thinner than the second region of the third semiconductor layer 71.

The second region of the third semiconductor layer 71 may correspond to a C(0001) plane as a polar plane, and the first region of the third semiconductor layer 71 may correspond to an R(1102) plane as a semi-polar plane.

The thickness of the first region of the third semiconductor layer 71 may be less than the thickness of the second region thereof. A ratio of the first region to the second region may be 1:50 to 1:2. Specifically, the ratio of the first region to the second region may be 1:5 to 3:10.

For example, the thickness of the first region of the third semiconductor layer 71 may be 1 nm to 50 nm. More specifically, the thickness of the first region of the third semiconductor layer 71 may be 1 nm to 5 nm. When the thickness of the first region of the third semiconductor layer 71 is less than 1 nm, electrons may pass due to the small thickness and the electron blocking function may be deteriorated. When the thickness of the first region of the third semiconductor layer 71 is greater than 50 nm, crystal quality may be deteriorated by an aluminum composition as the thickness of the semiconductor layer including the aluminum composition increases.

The third semiconductor layer 71 may be formed with a single layer or a multi-layer. When the third semiconductor layer 71 is the multi-layer, the third semiconductor layer 71 may include a super lattice structure. The super lattice structure may be a stacked structure of AlGaN/AlGaN having different aluminum compositions, or may include a super lattice structure of AlGaN/GaN. The super lattice structure of the third semiconductor layer 71 may protect the active layer 50 by diffusing a current abnormally included in a voltage.

<Fourth Semiconductor Layer>

The fourth semiconductor layer 72 may be disposed on the third semiconductor layer 71. The fourth semiconductor layer 72 may be disposed between the third semiconductor layer 71 and the fifth semiconductor layer 73.

The fourth semiconductor layer 72 may be made of at least one of group III-V compound semiconductors or group II-VI compound semiconductors. The fourth semiconductor layer 72 may be made of, for example, a semiconductor material having an empirical formula of $In_xAl_yGa_{1-x-y}N$ ($0 \leq x \leq 1$, $0 \leq y \leq$, $0 \leq x+y \leq 1$). The fourth semiconductor layer 72 may include, for example, at least one of GaN, AlN, AlGaN, InGaN, InN, InAlGaN, AlInN, AlGaAs, GaP, GaAs, GaAsP, or AlGaInP. As the fourth semiconductor layer 72 of the embodiment, GaN will be described as an example. The fourth semiconductor layer 72 may be an undoped semiconductor layer, but the present invention is not limited thereto.

The fourth semiconductor layer 72 may include a bandgap lower than that of the third and fifth semiconductor layers 71 and 73. The fourth semiconductor layer 72 is disposed between the third and fifth semiconductor layers 71 and 73 to increase hole injection efficiency by a 2-dimensional hole gas (2DHG) effect caused by a bandgap lower than that of the third and fifth semiconductor layers 71 and 73.

The fourth semiconductor layer 72 may include V-pits V. A first region of the fourth semiconductor layer 72 may be disposed on the V-pits V. In addition, a second region of the fourth semiconductor layer 72 may be disposed outside the V-pits V. The second region of the fourth semiconductor layer 72 may be disposed above the first region and may include a flat surface in a first direction. The thickness of the first region of the fourth semiconductor layer 72 may be less than the thickness of the second region thereof.

The second region of the fourth semiconductor layer 72 may correspond to a C(0001) plane as a polar plane, and the first region of the fourth semiconductor layer 72 may correspond to an R(1102) plane as a semi-polar plane.

<Fifth Semiconductor Layer>

The fifth semiconductor layer 73 may be disposed on the fourth semiconductor layer 72. The fifth semiconductor layer 73 may include a current blocking function for blocking holes traveling in a vertical direction from the sixth semiconductor layer 60. The fifth semiconductor layer 73 may guide holes to be injected through the V-pits V to improve carrier injection efficiency.

In this end, the fifth semiconductor layer 73 may include V-pits V. A first region 73S of the fifth semiconductor layer 73 may be disposed on the V-pits V. In addition, a second region 73T of the fifth semiconductor layer 73 may be disposed outside the V-pits V. The second region 73T of the fifth semiconductor layer 73 may be disposed above the first region 73S of the fifth semiconductor layer 73 and may include a flat surface in a first direction. The first region 73S of the fifth semiconductor layer 73 may be thinner than the second region 73T of the fifth semiconductor layer 73. The embodiment may improve the luminous efficiency by guiding injection of holes through the V-pits V by the fifth semiconductor layer 73 including the first region 73S that is thinner than the second region 73T.

The second region 73T of the fifth semiconductor layer 73 may correspond to a C(0001) plane as a polar plane, and the first region 73S of the fifth semiconductor layer 73 may correspond to an R(1102) plane as a semi-polar plane.

When the thickness of the first region 73S of the fifth semiconductor layer 73 is t1 and the thickness of the second region 73T of the fifth semiconductor layer 73 is t2, the fifth semiconductor layer 73 may have a relationship of t1<t2. A t1:t2 ratio may be 1:50 to 1:2. Specifically, the t1:t2 ratio may be 1:5 to 3:10.

For example, the thickness of the first region 73S of the fifth semiconductor layer 73 may be 1 nm to 50 nm. More specifically, the thickness of the first region 73S of the fifth semiconductor layer 73 may be 1 nm to 5 nm. When the thickness of the first region 73S of the fifth semiconductor layer 73 is less than 1 nm, electrons may pass due to the small thickness and the electron blocking function may be deteriorated. When the thickness of the first region 73S of the fifth semiconductor layer 73 is greater than 50 nm, crystal quality may be deteriorated by an aluminum composition as the thickness of the semiconductor layer including the aluminum composition increases.

The fifth semiconductor layer 73 may include, for example, at least one of compound semiconductors, such as GaN, InN, AlN, InGaN, AlGaN, InAlGaN, and AlInN. The fifth semiconductor layer 73 may include an empirical formula of, for example, $In_xAl_yGa_{1-x-y}N$ ($0 \le x \le 1$, $0 \le y \le$, $0 \le x+y \le 1$). The fifth semiconductor layer 73 may be made of an AlN-based semiconductor having a bandgap wider than that of the barrier layer of the active layer 50. For example, the AlN-based semiconductor may include at least one selected from AlN, AlGaN, InAlGaN, and AlInN-based semiconductors. The fifth semiconductor layer 73 may include a bandgap wider than that of the third semiconductor layer 71, but the present invention is not limited thereto. For example, the bandgap of the fifth semiconductor layer 73 may be the same as the bandgap of the third semiconductor layer 71. The fifth semiconductor layer 73 may be an undoped semiconductor layer, but the present invention is not limited thereto.

For example, the fifth semiconductor layer 73 may be an n-type semiconductor layer doped with an n-type dopant such as Si, Ge, Sn, Se, and Te. In addition, the fifth semiconductor layer 73 may be a p-type semiconductor layer including a p-type dopant such as Mg, Zn, Ca, Sr, and Ba. In addition, the fifth semiconductor layer 73 may be an insulating layer containing oxide or carbon.

The fifth semiconductor layer 73 may be formed with a single layer or a multi-layer. When the fifth semiconductor layer 73 is the multi-layer, the fifth semiconductor layer 73 may include a super lattice structure. The super lattice structure may be a stacked structure of AlGaN/AlGaN having different aluminum compositions, or may include a super lattice structure of AlGaN/GaN. The super lattice structure of the fifth semiconductor layer 73 may protect the active layer 50 by diffusing a current abnormally included in a voltage.

<Sixth Semiconductor Layer>

The sixth semiconductor layer 60 may be disposed on the fifth semiconductor layer 73. The sixth semiconductor layer 60 may be formed with a single layer or a multi-layer. The sixth semiconductor layer 60 may have a flat upper surface. The sixth semiconductor layer 60 may be disposed on the V-pits V.

The sixth semiconductor layer 60 may be made of at least one of group III-V compound semiconductors or group II-VI compound semiconductors. The sixth semiconductor layer 60 may be made of, for example, a semiconductor material having an empirical formula of $In_xAl_yGa_{1-x-y}N$ ($0 \le x \le 1$, $0 \le y \le$, $0 \le x+y \le 1$). The sixth semiconductor layer 60 may include, for example, at least one of GaN, AlN, AlGaN, InGaN, InN, InAlGaN, AlInN, AlGaAs, GaP, GaAs, GaAsP, or AlGaInP. The sixth semiconductor layer 60 may be a p-type semiconductor layer including a p-type dopant such as Mg, Zn, Ca, Sr, and Ba.

The first semiconductor layer 40 of the embodiment may be implemented by an n-type semiconductor layer and the sixth semiconductor layer 60 may be implemented by a p-type semiconductor layer, but the present invention is not limited thereto. The first semiconductor layer 40 may be a p-type semiconductor layer, and the sixth semiconductor layer 60 may be an n-type semiconductor layer. In addition, a semiconductor layer (for example, an n-type semiconductor layer (not illustrated)) having a polarity opposite to that of the second conductivity type may be formed on the sixth semiconductor layer 60. Therefore, the semiconductor device 101 of the embodiment may have any one structure selected from an n-p junction structure, a p-n junction structure, an n-p-n junction structure, and a p-n-p junction structure.

In the semiconductor device 101 of the embodiment, the third to fifth semiconductor layers 71, 72, and 73 are disposed on the active layer 50 to reduce carrier injection in the vertical direction, and may increase carrier injection through the V-pits V to improve the luminous efficiency.

Since the semiconductor device 101 of the embodiment includes the fifth semiconductor layer 73 in which a ratio of the thickness of the second region 73T corresponding to the C(0001) plane to the thickness of the first region 73S corresponding to the R(1102) plane is 1:50 to 1:2, hole injection efficiency is increased by 2DHG effect and simultaneously the injection of carriers injected through the V-pits V is increased to improve the luminous efficiency.

FIGS. 5 to 9 are views illustrating a method of manufacturing a semiconductor device according to an embodiment.

Referring to FIG. 5, in an embodiment, a buffer layer 30 and a first semiconductor layer 40 may be formed on a substrate 20.

The substrate 20 is loaded into a growth apparatus, and a layer or a pattern may be formed on the substrate 20 by using a compound semiconductor of group III-V elements or group II-VI elements.

The growth apparatus may employ an electron beam evaporator, a PVD apparatus, a CVD apparatus, a PLD apparatus, a dual-type thermal evaporator, a sputtering apparatus, an MOCVD apparatus, or the like, but the present invention is not limited to these apparatuses.

The substrate 20 may be a conductive substrate or an insulating substrate. For example, the growth substrate 20 may be selected from the group consisting of a sapphire substrate ($Al_2O_3$), GaN, SiC, ZnO, Si, GaP, InP, $Ga_2O_3$, and GaAs.

The buffer layer 30 may be formed on the substrate 20. The buffer layer 30 may be formed with at least one layer by using group III-V compound semiconductors or group II-VI compound semiconductors. The buffer layer 30 may be made of, for example, a semiconductor material having an empirical formula of $In_xAl_yGa_{1-x-y}N$ ($0 \le x \le 1$, $0 \le y \le$, $0 \le x+$ y≤1). The buffer layer 30 may include, for example, at least one of GaN, AlN, AlGaN, InGaN, InN, InAlGaN, AlInN, AlGaAs, GaP, GaAs, GaAsP, AlGaInP, or ZnO.

The first semiconductor layer 40 may be formed on the buffer layer 30. The first semiconductor layer 40 may be made of at least one of group III-V compound semiconductors or group II-VI compound semiconductors. The first semiconductor layer 40 may be made of, for example, a semiconductor material having an empirical formula of $In_xAl_yGa_{1-x-y}N$ ($0 \leq x \leq 1$, $0 \leq y \leq$, $0 \leq x+y \leq 1$). The first semiconductor layer 40 may include, for example, at least one of GaN, AlN, AlGaN, InGaN, InN, InAlGaN, AlInN, AlGaAs, GaP, GaAs, GaAsP, or AlGaInP. The first semiconductor layer 40 may be an n-type semiconductor layer doped with an n-type dopant such as Si, Ge, Sn, Se, and Te.

Referring to FIG. 6, a second semiconductor layer 41 may be two-dimensionally grown on the first semiconductor layer 40 at a low temperature of 1,000° C. or less to form V-pits V on a plurality of treading dislocations TD. The lower vertex of the V-pits V may correspond to each treading dislocation TD. Specifically, the lower vertex of the V-pits V may be in contact with the treading dislocation TD.

The second semiconductor layer 41 may be made of at least one of group III-V compound semiconductors or group II-VI compound semiconductors. The second semiconductor layer 41 may be made of, for example, a semiconductor material having an empirical formula of $In_xAl_yGa_{1-x-y}N$ ($0 \leq x \leq 1$, $0 \leq y \leq$, $0 \leq x+y \leq 1$). The second semiconductor layer 41 may include, for example, at least one of GaN, AlN, AlGaN, InGaN, InN, InAlGaN, AlInN, AlGaAs, GaP, GaAs, GaAsP, or AlGaInP. The second semiconductor layer 41 may be an n-type semiconductor layer doped with an n-type dopant such as Si, Ge, Sn, Se, and Te.

Referring to FIG. 6, a seventh semiconductor layer 43 may be formed on the second semiconductor layer 41. The active layer 50 may be formed on the second semiconductor layer 41.

The seventh semiconductor layer 43 and the active layer 50 may be grown at a low temperature of 1,000° C. or lower to include V pits V.

The seventh semiconductor layer 43 and the active layer 50 may be formed such that a first region corresponding to an R(1102) plane is thinner than a second region corresponding to a C(0001) plane.

The active layer 50 may be implemented by compound semiconductors. The active layer 50 may be made of at least one of group III-V compound semiconductors or group II-VI compound semiconductors. When the active layer 50 is implemented by a multi well structure, the active layer 50 may includes a plurality of well layers and a plurality of barrier layers alternately disposed. The plurality of well layer may be made of, for example, a semiconductor material having an empirical formula of $In_xAl_yGa_{1-x-y}N$ ($0 \leq x \leq 1$, $0 \leq y \leq$, $0 \leq x+y \leq 1$). The plurality of barrier layer may be made of, for example, a semiconductor material having an empirical formula of $In_xAl_yGa_{1-x-}$($0 \leq x \leq 1$, $0 \leq y \leq$, $0 \leq x+y \leq 1$). The well layer and the barrier layer each include at least one of pairs of InGaN/GaN, GaN/AlGaN, AlGaN/AlGaN, InGaN/AlGaN, InGaN/InGaN, AlGaAs/GaA, InGaAs/GaAs, InGaP/GaP, AlInGaP/InGaP, and InP/GaAs The seventh semiconductor layer 43 may be formed in a super lattice structure including a plurality of pairs. For example, the seventh semiconductor layer 43 may have a structure in which a plurality of pairs of semiconductor layers made of at least two selected from compound semiconductors such as GaN, InN, AlN, InGaN, AlGaN, InAl-GaN, and AlInN are alternately disposed. For example, the seventh semiconductor layer 43 may be InGaN/GaN including a plurality of pairs.

Referring to FIG. 8, third to fifth semiconductor layers 71, 72, and 73 may be formed on the active layer 50.

The third to fifth semiconductor layers 71, 72, and 73 may be grown at a low temperature of 1,000° C. or lower to include V pits (V).

The third to fifth semiconductor layers 71, 72, and 73 may be formed such that a first region corresponding to an R(1102) plane is thinner than a second region corresponding to a C(0001) plane.

The third semiconductor layer 71 may include, for example, at least one of compound semiconductors, such as GaN, InN, AlN, InGaN, AlGaN, InAlGaN, and AlInN. The third semiconductor layer 71 may include an empirical formula of, for example, $In_xAl_yGa_{1-x-y}N$ ($0 \leq x \leq 1$, $0 \leq y \leq$, $0 \leq x+y \leq 1$). The third semiconductor layer 71 may be made of an AlN-based semiconductor having a bandgap wider than that of the barrier layer of the active layer 50. The AlN-based semiconductor may include at least one selected from AlN, AlGaN, InAlGaN, and AlInN-based semiconductors. The third semiconductor layer 71 may be a p-type semiconductor layer including a p-type dopant such as Mg, Zn, Ca, Sr, and Ba.

A ratio of the first region to the second region of the third semiconductor layer 71 may be 1:50 to 1:2. Specifically, the ratio of the first region to the second region may be 1:5 to 3:10.

For example, the thickness of the first region of the third semiconductor layer 71 may be 1 nm to 50 nm. More specifically, the thickness of the first region of the third semiconductor layer 71 may be 1 nm to 5 nm. When the thickness of the first region of the third semiconductor layer 71 is less than 1 nm, electrons may pass due to the small thickness and the electron blocking function may be deteriorated. When the thickness of the first region of the third semiconductor layer 71 is greater than 50 nm, crystal quality may be deteriorated by an aluminum composition as the thickness of the semiconductor layer including the aluminum composition increases.

The third semiconductor layer 71 may be formed with a single layer or a multi-layer. When the third semiconductor layer 71 is the multi-layer, the third semiconductor layer 71 may include a super lattice structure. The super lattice structure may be a stacked structure of AlGaN/AlGaN having different aluminum compositions, or may include a super lattice structure of AlGaN/GaN. The super lattice structure of the third semiconductor layer 71 may protect the active layer 50 by diffusing a current abnormally included in a voltage.

The fourth semiconductor layer 72 may be made of at least one of group III-V compound semiconductors or group II-VI compound semiconductors. The fourth semiconductor layer 72 may be made of, for example, a semiconductor material having an empirical formula of $In_xAl_yGa_{1-x-y}N$ ($0 \leq x \leq 1$, $0 \leq y \leq$, $0 \leq x+y \leq 1$). The fourth semiconductor layer 72 may include, for example, at least one of GaN, AlN, AlGaN, InGaN, InN, InAlGaN, AlInN, AlGaAs, GaP, GaAs, GaAsP, or AlGaInP. As the fourth semiconductor layer 72 of the embodiment, GaN will be described as an example. The fourth semiconductor layer 72 may be an undoped semiconductor layer, but the present invention is not limited thereto.

The fourth semiconductor layer 72 may include a bandgap lower than that of the third and fifth semiconductor layers 71 and 73. The fourth semiconductor layer 72 is disposed between the third and fifth semiconductor layers 71 and 73 to increase hole injection efficiency by a 2-dimensional hole gas (2DHG) effect caused by a bandgap lower than that of the third and fifth semiconductor layers 71 and 73.

The fifth semiconductor layer 73 may include a current blocking function for blocking holes traveling in a vertical direction. The fifth semiconductor layer 73 may guide holes to be injected through the V-pits V to improve carrier injection efficiency.

A first region 73S of the fifth semiconductor layer 73 may be disposed on the V-pits V. In addition, a second region 73T of the fifth semiconductor layer 73 may be disposed outside the V-pits V. The second region 73T of the fifth semiconductor layer 73 may be disposed above the first region 73S of the fifth semiconductor layer 73 and may include a flat surface in a first direction.

The embodiment may improve the luminous efficiency by guiding injection of holes through the V-pits V by the fifth semiconductor layer 73 including the first region 73S that is thinner than the second region 73T.

When the thickness of the first region 73S of the fifth semiconductor layer 73 is t1 and the thickness of the second region 73T of the fifth semiconductor layer 73 is t2, the fifth semiconductor layer 73 may have a relationship of t1<t2. A t1:t2 ratio may be 1:50 to 1:2. Specifically, the t1:t2 ratio may be 1:5 to 3:10.

For example, the thickness of the first region 73S of the fifth semiconductor layer 73 may be 1 nm to 50 nm. More specifically, the thickness of the first region 73S of the fifth semiconductor layer 73 may be 1 nm to 5 nm. When the thickness of the first region 73S of the fifth semiconductor layer 73 is less than 1 nm, electrons may pass due to the small thickness and the electron blocking function may be deteriorated. When the thickness of the first region 73S of the fifth semiconductor layer 73 is greater than 50 nm, crystal quality may be deteriorated by an aluminum composition as the thickness of the semiconductor layer including the aluminum composition increases.

The fifth semiconductor layer 73 may include, for example, at least one of compound semiconductors, such as GaN, InN, AlN, InGaN, AlGaN, InAlGaN, and AlInN. The fifth semiconductor layer 73 may include an empirical formula of, for example, $In_xAl_yGa_{1-x-y}N$ ($0 \leq x \leq 1$, $0 \leq y \leq$, $0 \leq x+y \leq 1$). The fifth semiconductor layer 73 may be made of an AlN-based semiconductor having a bandgap wider than that of the barrier layer of the active layer 50. For example, the AlN-based semiconductor may include at least one selected from AlN, AlGaN, InAlGaN, and AlInN-based semiconductors. The fifth semiconductor layer 73 may include a bandgap wider than that of the third semiconductor layer 71, but the present invention is not limited thereto. For example, the bandgap of the fifth semiconductor layer 73 may be the same as the bandgap of the third semiconductor layer 71. The fifth semiconductor layer 73 may be an undoped semiconductor layer, but the present invention is not limited thereto.

For example, the fifth semiconductor layer 73 may be an n-type semiconductor layer doped with an n-type dopant such as Si, Ge, Sn, Se, and Te. In addition, the fifth semiconductor layer 73 may be a p-type semiconductor layer including a p-type dopant such as Mg, Zn, Ca, Sr, and Ba. In addition, the fifth semiconductor layer 73 may be an insulating layer containing oxide or carbon.

The fifth semiconductor layer 73 may be formed with a single layer or a multi-layer. When the fifth semiconductor layer 73 is the multi-layer, the fifth semiconductor layer 73 may include a super lattice structure. The super lattice structure may be a stacked structure of AlGaN/AlGaN having different aluminum compositions, or may include a super lattice structure of AlGaN/GaN. The super lattice structure of the fifth semiconductor layer 73 may protect the active layer 50 by diffusing a current abnormally included in a voltage.

Referring to FIG. 9, a sixth semiconductor layer 60 may be formed on the fifth semiconductor layer 73. The sixth semiconductor layer 60 may be merged by filling the V-pits V through the enhancement of two-dimensional growth.

The sixth semiconductor layer 60 may be made of at least one of group III-V compound semiconductors or group II-VI compound semiconductors. The sixth semiconductor layer 60 may be made of, for example, a semiconductor material having an empirical formula of $In_xAl_yGa_{1-x-y}N$ ($0 \leq x \leq 1$, $0 \leq y \leq$, $0 \leq x+y \leq 1$). The sixth semiconductor layer 60 may include, for example, at least one of GaN, AlN, AlGaN, InGaN, InN, InAlGaN, AlInN, AlGaAs, GaP, GaAs, GaAsP, or AlGaInP. The sixth semiconductor layer 60 may be a p-type semiconductor layer including a p-type dopant such as Mg, Zn, Ca, Sr, and Ba.

The first semiconductor layer 40 of the embodiment may be implemented by an n-type semiconductor layer and the sixth semiconductor layer 60 may be implemented by a p-type semiconductor layer, but the present invention is not limited thereto. The first semiconductor layer 40 may be a p-type semiconductor layer, and the sixth semiconductor layer 60 may be an n-type semiconductor layer. In addition, a semiconductor layer (for example, an n-type semiconductor layer (not illustrated)) having a polarity opposite to that of the second conductivity type may be formed on the sixth semiconductor layer 60. Therefore, the semiconductor device 101 of the embodiment may have any one structure selected from an n-p junction structure, a p-n junction structure, an n-p-n junction structure, and a p-n-p junction structure.

In the semiconductor device 101 of the embodiment, the third to fifth semiconductor layers 71, 72, and 73 are disposed on the active layer 50 to reduce carrier injection in the vertical direction, and may increase carrier injection through the V-pits V to improve the luminous efficiency.

Since the semiconductor device 101 of the embodiment includes the fifth semiconductor layer 73 in which a ratio of the thickness of the second region 73T corresponding to the C(0001) plane to the thickness of the first region 73S corresponding to the R(1102) plane is 1:50 to 1:2, hole injection efficiency is increased by 2DHG effect and simultaneously the injection of carriers injected through the V-pits V is increased to improve the luminous efficiency.

FIG. 10 is a view illustrating a horizontal type light emitting device including an electrode.

As illustrated in FIG. 10, in the horizontal type semiconductor device 101, the same reference numerals are assigned to the configurations corresponding to those illustrated in FIGS. 1 to 9, and the technical features of FIGS. 1 to 9 may be employed.

As illustrated in FIGS. 1 and 10, the horizontal type semiconductor device 101 may include a first electrode 191 and a second electrode 195. The first electrode 191 may be electrically connected to the first semiconductor layer 40. The second electrode 195 may be electrically connected to the sixth semiconductor layer 60. The first electrode 191 may be disposed on the first semiconductor layer 40, and the second electrode 195 may be disposed on the second semiconductor layer 70.

The first electrode 191 and the second electrode 195 may further include a current diffusion pattern having an arm structure or a finger structure. The first electrode 191 and the second electrode 195 may be made of a non-light-transmitting metal having characteristics of ohmic contact, a contact layer, and a bonding layer, but the present invention is not limited thereto. The first electrode 193 and the second electrode 195 may be selected from Ti, Ru, Rh, Ir, Mg, Zn, Al, In, Ta, Pd, Co, Ni, Si, Ge, Ag, Au, and selective alloys thereof.

Here, a conductive layer 80 having an ohmic function may be disposed between the second electrode 195 and the sixth semiconductor layer 60.

The conductive layer 80 may include at least one conductive material. The conductive layer 80 may be a single layer or a multi-layer The conductive layer 80 may include at least one of a metal, a metal oxide, or a metal nitride. The conductive layer 80 may include a light-transmitting material. For example, the conductive layer 80 may include at least one of indium tin oxide (ITO), indium zinc oxide (IZO), IZO nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, Ni/IrOx/Au/ITO, Pt, Ni, Au, Rh, or Pd.

An insulating layer 180 may be disposed on the conductive layer 80. The insulating layer 180 may be disposed on the side surfaces of the conductive layer 80, the third to sixth semiconductor layers 43, 90, 45, and 60, and the active layer 50. In addition, the insulating layer 180 may be disposed on the upper surface of the second semiconductor layer 41 exposed from the fourth semiconductor layer 90, and may be directly in contact with the first and second electrodes 191 and 195. The insulating layer 180 includes an insulating material or an insulating resin made of at least one of oxide, nitride, fluoride, and sulfide including at least one of Al, Cr, Si, Ti, Zn, or Zr. The insulating layer 180 may be selectively made of, for example, SiO2, Si3N4, Al2O3, and TiO2. The insulating layer 180 may be formed with a single layer or a multi-layer, but the present invention is not limited thereto.

FIG. 11 is a view illustrating a vertical type light emitting device including an electrode.

As illustrated in FIG. 11, in the semiconductor device 102, the same reference numerals are assigned to the configurations corresponding to those illustrated in FIGS. 1 to 10, and the technical features of FIGS. 1 to 9 may be employed.

As illustrated in FIG. 9, the semiconductor device 102 may include a first electrode 291 on a first semiconductor layer 40, and a second electrode 295 disposed on the side opposite to the first electrode 291.

The second electrode 295 may be disposed below the sixth semiconductor layer 60 and may include a conductive layer 281, a reflection layer 297, a bonding layer 298, and a support member 299.

The conductive layer 281 may be disposed on the sixth semiconductor layer 60. The conductive layer 281 may be in ohmic contact with the sixth semiconductor layer 60 and may include at least one conductive material. The conductive layer 281 may be a single layer or a multi-layer The conductive layer 281 may include at least one of a metal, a metal oxide, or a metal nitride. The conductive layer 281 may include a light-transmitting material. For example, the conductive layer 281 may include at least one of indium tin oxide (ITO), indium zinc oxide (IZO), IZO nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, Ni/IrOx/Au/ITO, Pt, Ni, Au, Rh, or Pd.

The reflection layer 297 may be disposed on the conductive layer 281. The reflection layer 297 may be formed in a structure including at least one layer made of a material selected from the group consisting of Ag, Ni, Al, Rh, Pd, Ir, Ru, Mg, Zn, Pt, Au, Hf, and any combination thereof.

The bonding layer 298 may be disposed on the reflection layer 297. The bonding layer 298 may be disposed between the support member 299 and the reflection layer 297. The bonding layer 298 may be used as a barrier metal or a bonding metal, and the material thereof may include, for example, at least one of Ti, Au, Sn, Ni, Cr, Ga, In, Bi, Cu, Ag, Ta, or selective alloys thereof.

The support member 299 may be disposed on the bonding layer 298 The support member 299 may be made of a conductive member such as copper (Cu), gold (Au), nickel (Ni), molybdenum (Mo), copper-tungsten (Cu—W), and carrier wafer (for example, Si, Ge, GaAs, ZnO, SiC, or the like). As another example, the support member 299 may be implemented by a conductive sheet.

A channel layer 283 and a current blocking layer 285 may be disposed between the sixth semiconductor layer 60 and the second electrode 295.

The channel layer 283 may be disposed at a lower edge region of the sixth semiconductor layer 60 and may be formed to have a ring shape, a loop shape, or a frame shape. The channel layer 283 may include a transparent conductive material or an insulating material. For example, the channel layer 283 may include at least one of ITO, IZO, IZTO, IAZO, IGZO, IGTO, AZO, ATO, SiO2, SiOx, SiOxNy, Si3N4, Al2O3, or TiO2. An inner part of the channel layer 283 is disposed below the sixth semiconductor layer 60, and an outer part of the channel layer 283 is disposed to be closer to an outer side than the side surface of the light emitting structure.

The current blocking layer 285 may be disposed between the sixth semiconductor layer 60 and the reflection layer 297. The current blocking layer 285 may include an insulating material. For example, the current blocking layer 85 may include at least one of SiO2, SiOx, SiOxNy, Si3N4, Al2O3, or TiO2. As another example, the current blocking layer 285 may be made of a metal for Schottky contact.

The current blocking layer 285 is disposed corresponding to the first electrode 291 disposed on the semiconductor layer in a thickness direction of the semiconductor layer. The current blocking layer 285 may block a current flowing in the shortest distance between the first and second electrodes 291 and 295 and guide the current to another path to realize a current spreading effect. One or more current blocking layers 285 may be disposed, and a partial or entire region thereof may be overlapped in a direction perpendicular to the first electrode 291.

Here, a light extraction structure (not illustrated) such as roughness may be formed on the first semiconductor layer 40. An insulating layer (not illustrated) is formed on the upper surface of the first semiconductor layer 40, the side surfaces of the first to sixth semiconductor layers 40, 41, 90, 43, and 45 and the active layer 50, and the upper surface of the channel layer 283, but the present invention is not limited thereto.

In the horizontal type and vertical type semiconductor devices 101 and 102 illustrated in FIGS. 10 and 11, the third to fifth semiconductor layers 71, 72, and 73 are disposed on the active layer 50 to reduce carrier injection in the vertical direction, and may increase carrier injection through the V-pits V to improve the luminous efficiency.

Since the semiconductor device 101 of the embodiment includes the fifth semiconductor layer 73 in which a ratio of the thickness of the second region 73T corresponding to the C(0001) plane to the thickness of the first region 73S corresponding to the R(1102) plane is 1:50 to 1:2, hole injection efficiency is increased by 2DHG effect and simultaneously the injection of carriers injected through the V-pits V is increased to improve the luminous efficiency.

FIG. 12 is a conceptual view of a semiconductor device according to another embodiment of the present disclosure.

FIG. 13 is a plan view illustrating recesses having various sizes according to an embodiment of the present invention.

Referring to FIG. 12, a semiconductor device 103 according to another embodiment of the present invention may include a first-conductivity-type semiconductor layer 300, an active layer 500 disposed on the first-conductivity-type semiconductor layer 300, and a second-conductivity-type semiconductor layer 700 disposed on the active layer 500. At least one of the first-conductivity-type semiconductor layer 300, the active layer 500, or the second-conductivity-type semiconductor layer 700 may include a V-shaped recess (V-pits) formed therein.

The substrate 100 may include a conductive substrate or an insulating substrate. The substrate 100 may be a material suitable for semiconductor material growth or a carrier wafer. The substrate 100 may be made of a material selected from sapphire (Al2O3), SiC, GaAs, GaN, ZnO, GaP, InP, and Ge, but the present invention is not limited thereto.

A buffer layer 200 may be disposed between the first-conductivity-type semiconductor layer 300 and the substrate 100. The buffer layer 200 may mitigate a lattice mismatch between the light emitting structure and the substrate 100.

The buffer layer 200 may be a combination of group III elements and group V elements, or may include any one of GaN, InN, AlN, InGaN, AlGaN, InAlGaN, and AlInN. The buffer layer 200 may be doped with a dopant, but the present invention is not limited thereto.

The buffer layer 200 may be grown into a single crystal on the substrate 100, and the buffer layer 200 grown into the single crystal may improve the crystallinity of the first-conductivity-type semiconductor layer 300 that is grown on the buffer layer 200.

The first-conductivity-type semiconductor layer 300 may be made of a compound semiconductor such as group III-V or group II-VI, and may be doped with a first dopant. The first-conductivity-type semiconductor layer 300 may be made of a semiconductor material having an empirical formula of $In_{x1}Al_{y1}Ga_{1-x1-y1}N$ ($0 \leq x1 \leq 1$, $0 \leq y1 \leq 1$, $0 \leq x1+y1 \leq 1$), for example, GaN, AlGaN, InGaN, and InAlGaN. The first dopant may be an n-type dopant such as Si, Ge, Sn, Se, and Te. When the first dopant is an n-type dopant, the first-conductivity-type semiconductor layer 300 doped with the first dopant may be an n-type semiconductor layer.

The active layer 500 is a layer in which electrons (or holes) injected through the first-conductivity-type semiconductor layer 300 and holes (or electrons) injected through the second-conductivity-type semiconductor layer 700 meet each other. Due to the recombination of the electrons and the holes, the active layer 500 may shift to a low energy level to emit light having a wavelength corresponding to the energy level.

The active layer 500 may have any one of a single well structure, a multi well structure, a single quantum well structure, a multi quantum well (MQW) structure, a quantum dot structure, or a quantum wire structure, but the structure of the active layer 500 is not limited thereto.

Generally, lattice defects such as dislocation (D) may occur in the first-conductivity-type semiconductor layer 300 due to a lattice mismatch between the substrate 100 and the first-conductivity-type semiconductor layer 300. A leakage current increases due to the dislocation (D) of the semiconductor device and may be vulnerable to external static electricity.

The active layer 500 may be formed with a recess R1 caused by the dislocation D. The size of the recess may be variously formed. The recess R1 relaxes a stress between the first-conductivity-type semiconductor layer 300 and the active layer 500, and prevents the dislocation D from extending to the active layer 500 and the second-conductivity-type semiconductor layer 700, thereby improving the quality of the semiconductor device.

The recess R1 may prevent a leakage current due to the dislocation D to improve the electrostatic discharge (ESD) yield. However, the region where the recess is formed does not contribute to the light emission, and thus the luminous intensity is lowered.

The second-conductivity-type semiconductor layer 700 may be formed on the active layer 500, may be made of a compound semiconductor such as group III-V or group II-VI, and may be doped with a second dopant. The second-conductivity-type semiconductor layer 700 may be made of a semiconductor material having an empirical formula of $In_{x5}Al_{y2}Ga_{1-x5-y2}N$ ($0 \leq x5 \leq 1$, $0 \leq y2 \leq 1$, $0 \leq x5+y2 \leq 1$) or a material selected from AlInN, AlGaAs, GaP, GaAs, GaAsP, and AlGaInP. When the second dopant is a p-type dopant such as Mg, Zn, Ca, Sr, and Ba, the second-conductivity-type semiconductor layer 700 doped with the second dopant may be a p-type semiconductor layer.

An electron blocking layer (EBL) 600 may be disposed between the active layer 500 and the second-conductivity-type semiconductor layer 700. The electron blocking layer 600 may block the flow of electrons supplied from the first-conductivity-type semiconductor layer 300 to the second-conductivity-type semiconductor layer 700, thereby increasing the probability that electrons and holes will recombine in the active layer 500. The energy bandgap of the electron blocking layer 600 may be greater than the energy bandgap of the active layer 500 and/or the second-conductivity-type semiconductor layer 700.

The electron blocking layer 600 may be made of a semiconductor material having an empirical formula of $In_{x1}Al_{y1}Ga_{1-x1-y1}N$ ($0 \leq x1 \leq 1$, $0 \leq y1 \leq 1$, $0 \leq x1+y1 \leq 1$), for example, AlGaN, InGaN, and InAlGaN, but the present invention is not limited thereto. Since the electron blocking layer 600 is formed on the active layer 500 having the recess, the electron blocking layer 600 may have a recess corresponding to the shape of the recess.

FIG. 14 is a graph illustrating a relationship between a color rendering index and light output.

Referring to FIG. 14, it can be seen that the color rendering index (CRI) and the light output have an inverse relationship. The color rendering index (CRI) is an index that evaluates how light of a light source makes an inherent color of an object appear a natural color.

As the wavelength of the semiconductor device increases, the color rendering index may be increased while the light output may be reduced. In particular, the light output increases at a peak wavelength of 450 nm or less with an increase in the color rendering index, but the light output decreases at a peak wavelength of more than 450 nm with an increase in the color rendering index. Therefore, there is a need to develop a semiconductor device capable of increasing the light output with an increase in the color rendering index at a peak wavelength of 450 nm or more, or 450 nm to 460 nm.

The light output is related to the main wavelength of the semiconductor device. This is because the efficiency of the phosphor technology in the commercialization stage is lowered below 450 nm.

It may be necessary to control the energy bandgap of the active layer 500 to have a peak wavelength of 450 nm or more in the semiconductor device. For example, when the active layer 500 is an InGaN well layer/a GaN barrier layer, the energy bandgap may be controlled by adjusting the composition of In of the well layer. However, if the composition of In is increased, the film quality of the active layer 500 is lowered, and the light output is lowered.

The thickness of the barrier layer may be increased to improve the film quality of the active layer 500. When the barrier layer is plural, the film quality may be improved by increasing the thicknesses of all the plurality of barrier layers. However, when the barrier layer becomes thick, there is a problem that the operating voltage rises.

As another method of improving the film quality of the active layer 500, a method of growing the barrier layer at a high temperature may be considered. When the barrier layer is grown at a high temperature, the crystallinity is improved to improve the film quality of the active layer 500. However, when the barrier layer is grown at a high temperature, there is a problem that the size of the V-shaped recess formed in the active layer 500 decreases or disappears.

When the size of the recess decreases or disappears, the sizes of the plurality of recesses become non-uniform, thus deteriorating the advantageous effect and reducing the yield. In addition, since it is difficult for the holes to be injected to the side of the recess, the light output may be reduced. Therefore, there is a need for a technique of growing the barrier layer at a high temperature to enhance the quality of the film while maintaining the recess.

FIG. 15 is a partial cross-sectional view of a semiconductor device according to another embodiment of the present invention.

FIG. 16 is an enlarged view of a portion A and a portion B in FIG. 16.

FIG. 17 is a view illustrating a cross section of a semiconductor device according to another embodiment of the present invention.

Referring to FIGS. 15 and 16, an active layer 500 may be disposed on a trigger layer 400. The composition of indium (In) of the trigger layer 400 may be higher than the composition of indium of the first-conductivity-type semiconductor layer 300. Generally, indium (In) has a large lattice size. Therefore, the recess due to the lattice mismatch may be more easily formed for a gallium nitride (GaN) layer containing a larger amount of indium. The trigger layer 400 may convert the dislocation into recess 410 to grow a plurality of recesses to a uniform size.

The active layer 500 may include a first active layer 510 and a second active layer 520. The first active layer 510 may be a layer disposed adjacent to the first-conductivity-type semiconductor layer 300, and the second active layer 520 may be a layer disposed between the first active layer 510 and the second-conductivity-type semiconductor layer 700.

The first active layer 510 and the second active layer 520 may include a first region P1 having a plurality of recesses R1, and a second region P2 between the plurality of recesses R1.

The first active layer 510 may include a plurality of first well layers 510a and a plurality of first barrier layers 510b alternately arranged. The second active layer 520 may include a plurality of second well layers 520a and a plurality of second barrier layers 520b alternately arranged.

Since the first active layer 510 is formed on the recess 410 formed in the trigger layer 400, a recess R1 may be formed in the first region P1 and a relatively flat region may be formed in the second region P2. Similarly, since the second active layer 520 is formed on the recess R1 of the first active layer 510, a recess R1 may be formed in the first region P1 and a relatively flat region may be formed in the second region P2.

The first active layer 510 may have a thickness smaller than that of the second region P2. The ratio of the thickness of the first region P1 to the thickness of the second region P2 in the first active layer 510 may be 1:2 to 1:10. When the first barrier layer 510b of the first active layer 510 is grown at a low temperature, the thickness of the first region P1 becomes smaller than the thickness of the second region P2 so that the shape of the recess R1 may be maintained. Here, the thickness of the first region P1 may be a distance of the light emitting structure in the thickness direction.

The first active layer 510 may hardly participate in light emission. That is, since the holes injected from the second-conductivity-type semiconductor layer 700 are relatively heavy, the holes may not be injected into the first active layer 510. Therefore, the first active layer 510 may not participate in light emission, or may generate relatively weak light. In an embodiment, the first active layer 510 may function to maintain the shape of the recess R1.

In the first barrier layer 510, the thickness of the first region P1 may be smaller than the thickness of the second region P2. Similarly to the first barrier layer 510b, the thickness of the first region P1 in the first well layer 510a may be smaller than the thickness of the second region P2. Alternatively, for the thickness of the first well layer 510a, there may be no great difference between the first region P1 and the second region P2. In an embodiment, the shape of the recess may be maintained by growing the first barrier layer 510b at a low temperature and controlling the thickness to be small in the first region P1.

In the first barrier layer 510b, the ratio of the thickness of the first region P1 to the thickness of the second region P2 may be 1:2 to 1:10. When the thickness ratio is smaller than 1:2, the thickness in the first region P1 may increase and the size of the recess R1 may gradually become smaller. When the size of the recess R1 begins to decrease in the first active layer 510, the recess R1 may disappear during the growth of the second active layer 520. When the thickness ratio is larger than 1:10, the thickness in the first region P1 becomes too small, and the first barrier layer 510b may be broken in some regions.

The ratio of the thickness of the first well layer 510a to the thickness of the first barrier layer 510b may be 1:1 to 1:2.5. For example, the thickness of the first well layer 510a may be 2 nm and 5 nm, and the thickness of the first barrier layer 510b may be 2 nm and 12.5 nm.

Since the second active layer 520 is disposed between the first active layer 510 and the second-conductivity-type semiconductor layer 700, most of the second active layer 520 may participate in light emission. According to an embodiment, since the active layer 500 includes In so as to generate light having a long wavelength range of 450 nm to 460 nm, the quality of the film may relatively decrease. Therefore, the second barrier layer 520b may be grown at a high temperature to compensate for the quality of the film.

The first region of the second barrier layer 520b may gradually become narrower toward the second-conductivity-type semiconductor layer 700 (from P1 to P3). When the second barrier layer 520b is grown at a high temperature, the wafer is warped. Therefore, the first region P1 may become relatively thick. Consequently, the thickness of the first region P1 in the second active layer 520 may be larger than the thickness of the second region P2.

Specifically, in the second barrier layer 520b, the thickness of the first region P1 may be larger than the thickness of the second region P2. Similarly to the second barrier layer 520b, the thickness of the first region P1 in the second well layer 520a may be larger than the thickness of the second region P1. Alternatively, for the thickness of the second well layer 520a, there may be no great difference between the first region P1 and the second region P2.

The thickness of the second barrier layer 520b in the first region P1 may be larger than the thickness of the first barrier layer 510b. This is because the second barrier layer 520b is grown at a higher temperature than the first barrier layer 510b. However, the thickness of the second active layer 520 in the first region P1 may not be significantly different from the thickness of the first active layer 510. This is because the first active layer 510 and the second active layer 520 are grown at substantially similar temperatures. Therefore, the thickness of the second active layer 520 in the first region P1 may be larger than the thickness of the first active layer 510.

The second barrier layer 520b may have a section where the thickness increases toward the center of the recess R1 (closer to the dislocation propagation path D). That is, the second barrier layer 520b may gradually grown thicker toward the center of the recess R1. In addition, in the second barrier layer 520b, the size of the recess RI may be reduced as the distance from the first active layer 510 increases.

The ratio of the thickness of the first region P1 to the thickness of the second region P2 in the second barrier layer 520b may be between 2:1 and 10:1. When the thickness ratio is less than 2:1, the thickness of the second barrier layer 520b may decrease and the film quality may deteriorate. When the thickness ratio is greater than 10:1, the size of the recess R1 may be excessively reduced.

In the second active layer 520, the thickness of the barrier layer 520b closest to the first active layer 510 may be larger than the thickness of the remaining barrier layer. That is, the thickness of the barrier layer may be largest in a section where the growth of the first active layer 510 is completed and the growth of the second active layer 520 is started.

The ratio of the thickness of the second well layer 520a to the thickness of the second barrier layer 520b may be 1:1 and 1:3. The thickness of the second well layer 520a may be 2 nm and 5 nm, and the thickness of the second barrier layer 520b may be 2 nm and 15 nm.

According to an embodiment, the first well layer 510a and the second well layer 520a may have the same thickness. However, the present invention is not necessarily limited thereto, and the second well layer 520a may be thicker than the first well layer 510a. In this case, since the thickness of the second active layer 520 participating in light emission increases, the luminous efficiency may be increased.

The first barrier layer 510b and the second barrier layer 520b may be doped with an n-type dopant. As the thicknesses of the first barrier layer 510b and the second barrier layer 520b increase, the operating voltage may be lowered. Therefore, the first and second barrier layers 510b and 520b may be doped with a dopant to lower the operating voltage. The doping concentration may be $1\times10^{16}/cm^3$ to $1\times10^{19}/cm^3$, but the present invention is not limited thereto.

According to the embodiment, the first barrier layer 510b may be grown at a low temperature to maintain the recess R1, and the second barrier layer 520b may be grown at a high temperature to improve the film quality of the second active layer 520. Therefore, light having a long wavelength band may be generated, and the light output may be improved.

Referring to FIG. 17, it can be seen that the thickness of the first barrier layer 510b gradually decreases from the second region P2 to the first region P1. Furthermore, it can be confirmed that the shape of the recess is maintained in the first active layer.

On the contrary, it can be seen that the thickness of the second barrier layer 520b gradually increases from the second region P2 to the first region P1. In addition, it can be seen that the thickness of the second barrier layer 520b becomes thicker toward the upper portion in the second active layer 520 (d3>d2>d1)

FIG. 18 is a partial cross-sectional view of a semiconductor device according to another embodiment of the present invention. FIG. 19 is a partial cross-sectional view of a semiconductor device according to further another embodiment of the present invention.

FIG. 20 is a partial cross-sectional view of a semiconductor device according to further another embodiment of the present invention.

Referring to FIG. 18, the electron blocking layer 600 and the second-conductivity-type semiconductor layer 700 disposed on the active layer 500 may be disposed inside the recess R1 of the active layer 500. Therefore, the holes injected from the second-conductivity-type semiconductor layer 700 may be injected into the active layer 500 through the electron blocking layer 600.

The thickness of the first active layer 510 and the thickness of the second active layer 520 may be appropriately adjusted so that the recess does not disappear when the second active layer 520 is grown.

The electron blocking layer 600 may be doped with a P-type dopant so as to enhance hole injection. If the P-type dopant is doped, the resistance may be lowered and the current injection may be increased. The P-type dopant may be one or more selected from the group consisting of Mg, Zn, Ca, Sr, and Ba.

In the second region P2, since the concentration of the P-type dopant is relatively high, the hole injection is relatively easy. In the first region P1, since the concentration of Al is relatively high and the concentration of the P-type dopant is low, hole injection becomes difficult. That is, the resistance of the first region P1 may be higher than that of the second region P2. As the thickness of the first region P1 becomes smaller, the doping of the P-type dopant may become difficult. Therefore, the electron blocking layer 600 may be grown at a high temperature to increase the thickness in the recess. As a result, the doping concentration of the dopant may be increased. For example, the electron blocking layer 600 may be grown at 790° C. to 1,230° C. to control the thickness ratio of the first region P1 to the second region P2 to be 0.8:1 to 1:1.

Referring to FIG. 19, only the thickness of the second barrier layer 520b of the second active layer 520 may be controlled to improve the film quality. According to an embodiment, since the second barrier layer 520b is not grown at a high temperature, the problem that the second barrier layer 520b grows excessively in the first region P1 to reduce the recess may be solved.

In addition, as illustrated in FIG. 20, the first to third active layers 510, 520, and 530 may be set to three sections, and the barrier layers of the first to third active layers 510, 520, and 530 may be grown under different temperature conditions. For example, the barrier layer of the first section 510 may be grown at 200° C. to 230° C., the barrier layer of the second section 520 may be grown at 230° C. to 260° C., and the barrier layer of the third section 530 may be grown at 260° C. to 270° C.

According to an embodiment, the barrier layer may be prevented from growing rapidly in the recess by raising the growth temperature step by step. Therefore, a reduction in the size of the recess in the active layer may be suppressed.

FIG. 21 is a flowchart for describing a method of manufacturing a semiconductor device according to an embodiment of the present invention.

Referring to FIG. 21, in the method of manufacturing the semiconductor device, a first-conductivity-type semiconductor layer 300, an active layer 500, an electron blocking layer 600, and a second-conductivity-type semiconductor layer 700 are sequentially formed on a substrate 100. In particular, the active layer 500 may be divided into operation of growing a first active layer 510 (S10) and operation of growing a second active layer 520 (step S20).

The operation of growing the first active layer 510 may include forming the first well layer 510a at 700° C. to 800° C. and growing the first barrier layer 510b at 780° C. to 1,030° C. Since the growth temperature of the first barrier layer 510b is relatively low, the first barrier layer 510b may be grown to a small thickness in the first region P1.

In order to lower the operating voltage, the first barrier layer 510b may be doped with silicon. The doping concentration may be 1×1016/cm3 to 1×1019/cm3, but the present invention is not limited thereto.

The operation of growing the second active layer 520 may include forming the second well layer 520a at 700° C. to 800° C. and growing the second barrier layer 520b at 790° C. to 1,230° C. That is, the growth temperature of the second barrier layer 520b may be set to be higher than the growth temperature of the first barrier layer 510b.

Therefore, the crystallinity of the second barrier layer 520b may be improved. In addition, the second barrier layer 520b may be grown thicker than the first barrier layer 510b in the first region P1. Alternatively, since the wafer is bent at the growth temperature of the second barrier layer 520b, the first region P1 may become relatively thick. When the second barrier layer 520b is grown, a growth gas may be supplied more than when the first barrier layer 510b is grown. However, the present invention is not limited thereto.

The second barrier layer 520b may be doped with silicon. The doping concentration may be 1×1016/cm3 to 1×1019/cm3, but the present invention is not limited thereto.

FIG. 22 is a cross-sectional view illustrating a semiconductor device package according to an embodiment.

Referring to FIG. 22, the semiconductor device package according to the embodiment may include a body 1, a first lead electrode 3 and a second lead electrode 4 provided on the body 1, semiconductor devices 101, 102, and 103 receiving power from the first and second lead electrodes 3 and 4, and a molding member 5 surrounding the semiconductor devices 101, 102, and 103.

The body 1 may include a silicon material, a synthetic resin material, or a metal material, and the inclined surface 1a may be formed around the semiconductor devices 101, 102, and 103.

The first lead electrode 3 and the second lead electrode 5 are electrically separated from each other to supply power to the semiconductor device 101.

In addition, the first lead electrode 3 and the second lead electrode 4 may reflect light generated by the semiconductor devices 101, 102, and 103 to thereby increase the luminous efficiency, and may serve to discharge heat generated by the semiconductor devices 101, 102, and 103 to the outside.

The semiconductor devices 101, 102, and 103 may be provided on any one of the first lead electrode 3, the second lead electrode 4, and the body 1, and may be electrically connected to the first and second lead electrodes 3 and 4 by a wire method, a die bonding method, or the like, but the present invention is not limited thereto. For example, one side of each of the semiconductor devices 101, 102, and 103, for example, the back side of each of the semiconductor devices 101, 102, 103 is in electrical contact with the upper side of the first lead electrode 3, and the other side of each of the semiconductor devices 101, 102, and 103 may be electrically connected to the second lead electrode 4 by using a wire.

The semiconductor devices 101, 102, and 103 of the embodiment may be any of the horizontal type semiconductor device, the flip type semiconductor device, and the vertical type semiconductor device described above, but the present invention is not limited thereto.

The molding member 5 may surround the semiconductor devices 101, 102, and 103 to protect the semiconductor devices 101, 102, and 103. In addition, the molding member 5 may include a phosphor so as to change a wavelength of the light emitted by the semiconductor devices 101, 102, and 103.

The semiconductor device package according to the embodiment includes a chip on board (COB) type. The upper surface of the body 1 may be flat, and a plurality of semiconductor devices 101 and 102 may be provided on the body 1.

The semiconductor device may be used as a light source of an illumination system, a light source of an image display device, or a light source of a lighting device. That is, the semiconductor device may be applied to various electronic devices arranged in a case to provide light. For example, when a semiconductor device and an RGB phosphor are mixed and used, white light with excellent color rendering index (CRI) may be realized.

The semiconductor device may include second V-pits without a treading dislocation defect (TD) using a Si-rich fourth semiconductor layer having a high concentration ratio of silicon atoms, thereby improving the carrier injection efficiency. That is, the embodiment may improve the operating voltage rise and the carrier injection efficiency deterioration that may occur in a high-quality template having a treading dislocation (TD) density of 1E8/cm2 or less.

In addition, the semiconductor device package of the embodiment includes the second V-pits to improve the carrier injection efficiency and minimize a reduction in the light emitting area, thereby improving the luminous efficiency.

The above-described semiconductor device includes a light emitting device package and may be used as a light source of an illumination system, for example, as a light source of an image display device or a light source of a lighting device.

When used as a backlight unit of an image display device, the semiconductor device may be used as an edge type backlight unit or as a direct-type backlight unit. When used as a light source of a lighting device, the semiconductor device may be used as a lighting fixture or a bulb type, or may be used as a light source of a mobile terminal.

The semiconductor device includes a laser diode in addition to the light emitting diode described above.

The laser diode may include the first-conductivity-type semiconductor layer, the active layer, and the second-conductivity-type semiconductor layer having the above-described structures, like the light emitting device. Although an electro-luminescence phenomenon in which light is emitted when a current flows through a p-type first-conductivity-type semiconductor and an n-type second-conductivity-type semiconductor bonded to each other is used, there is a difference in the direction and phase of emitted light. That is, the laser diode may emit light having one specific wavelength (monochromatic beam) having the same phase and in the same direction by using a phenomenon called stimulated emission and a constructive interference phenomenon. Due to these characteristics, the laser diode may be used for optical communication, medical equipment, and semiconductor processing equipment.

As the light receiving device, a photodetector, which is a kind of transducer that detects light and converts the intensity of the light into an electric signal, is exemplified. Examples of the photodetector include a photocell (silicon, selenium), an optical output element (cadmium sulfide, cadmium selenide), a photodiode (e.g., a PD with a peak wavelength in a visible blind spectral region or a true blind spectral region), a photo transistor, a photoelectron booster tube, a photo tube (vacuum, gas filling), and an IR (Infra-Red) detector, but the embodiments are not limited thereto.

In addition, the semiconductor device such as the photodetector may be manufactured by using a direct bandgap semiconductor that is generally excellent in photo-conversion efficiency. Alternatively, the photodetector has a variety of structures, and the most general structure thereof includes a pinned photodetector using a pn junction, a Schottky photodetector using a Schottky junction, and a metal-semiconductor-metal (MSM) photodetector.

Like the light emitting device, the photodiode may include the first-conductivity-type semiconductor layer having the structure described above, the active layer, and the second-conductivity-type semiconductor layer, and may have a pn junction or a pin structure. The photodiode operates by applying reverse bias or zero bias. When light is incident on the photodiode, electrons and holes are generated and a current flows. At this time, the magnitude of the current may be approximately proportional to the intensity of the light incident on the photodiode.

A photovoltaic cell or a solar cell is a type of photodiode that may convert light into current. The solar cell may include the first-conductivity-type semiconductor layer, the active layer, and the second-conductivity-type semiconductor layer having the above-described structures, like the light emitting device.

In addition, the semiconductor device may be used as a rectifier of an electronic circuit through a rectifying characteristic of a general diode using a p-n junction, and may be applied to a microwave circuit so as to be applied to an oscillation circuit or the like.

In addition, the above-described semiconductor device is not necessarily made of a semiconductor, and may further include a metal material in some cases. For example, the semiconductor device such as the light receiving device may be implemented by using at least one of Ag, Al, Au, In, Ga, N, Zn, Se, P, or As, and may be implemented by using an intrinsic semiconductor material or a semiconductor material doped with a p-type or n-type dopant.

While the present invention has been described with reference to embodiments, this is merely an example and does not limit the scope of the invention. It will be understood by those skilled in the art that various changes and applications may be made thereto without departing from the spirit and scope of the invention. For example, the respective components specifically shown in the embodiments may be modified and implemented. It will be understood that the differences related to these changes and applications are included in the scope of the invention as defined in the appended claims.

The invention claimed is:

1. A semiconductor device comprising:
a first semiconductor layer;
a second semiconductor layer disposed on the first semiconductor layer and comprising first V-pits;
an active layer disposed on the second semiconductor layer and comprising second V-pits disposed on the first V-pits;
a third semiconductor layer disposed on the active layer and comprising third V-pits disposed on the second V-pits;
a fourth semiconductor layer disposed on the third semiconductor layer and comprising fourth V-pits disposed on the third V-pits;
a fifth semiconductor layer disposed on the fourth semiconductor layer and comprising fifth V-pits disposed on the fourth V-pits;
a sixth semiconductor layer disposed on the fifth semiconductor layer;
wherein the first and second semiconductor layers are an n-type semiconductor layer doped with an n-type dopant,
wherein the third and sixth semiconductor layers are a p-type semiconductor layer doped with a p-type dopant,
wherein the third semiconductor layer includes a bandgap wider than a bandgap of the active layer,
wherein the fourth semiconductor layer includes a bandgap lower than the bandgap of the third semiconductor layer,
wherein the fifth semiconductor layer includes a bandgap wider than the bandgaps of the third and fourth semiconductor layers,
wherein the active layer includes a first region disposed on the first V-pits, and a second region disposed outside the first region and the first V-pits,
wherein the second region of the active layer is disposed to be higher than the first region of the active layer,
wherein the third semiconductor layer includes a first region disposed on the second V-pits, and a second region disposed outside the first region on the third semiconductor layer and the second V-pits,
wherein the second region of the third semiconductor layer is disposed to be higher than the first region of the third semiconductor layer,
wherein a thickness of the first region of the third semiconductor layer is less than a thickness of the second region of the third semiconductor layer,
wherein the thickness of the first region of the third semiconductor layer is 1 nm to 50 nm,
wherein the third semiconductor layer and the fifth semiconductor layer comprise an aluminum composition,
wherein the sixth semiconductor layer has a bandgap equal to the bandgap of the fourth semiconductor layer,
wherein the active layer includes a first width which is a width of the second V-pits which is parallel to an upper portion of the active layer in a horizontal direction, wherein the fifth semiconductor layer includes a second width which is a width of the fifth V-pits which is parallel to an upper portion of the fifth semiconductor layer in the horizontal direction,
wherein the second width is greater than the first width,
wherein the first width is 200 nm to 300 nm, and the second width is 300 nm to 400 nm,
wherein a width of each of the first to fifth V-pits is gradually increased in the direction from a top surface of the first semiconductor layer to a top surface of the sixth semiconductor layer,
wherein a lower vertex of each of the first to fifth V-pits is disposed between a bottom surface of the second semiconductor layer and a top surface of the second semiconductor layer.

2. The semiconductor device according to claim 1, wherein a seventh semiconductor layer is comprised between the active layer and the second semiconductor layer,
wherein the seventh semiconductor layer has a structure in which a plurality of pairs of semiconductor layers made of at least two selected from compound semiconductors including GaN, InN, AlN, InGaN, AlGaN, InAlGaN, and AlInN are alternately disposed.

3. The semiconductor device according to claim 1, wherein the fourth semiconductor layer includes a first region disposed on the third V-pits, and a second region disposed outside the first region of the fourth semiconductor layer and the third V-pits.

4. The semiconductor device according to claim 3, wherein a thickness of the first region of the fourth semiconductor layer is less than a thickness of the second region of the fourth semiconductor layer.

5. The semiconductor device according to claim 1, wherein the fifth semiconductor layer includes a first region disposed on the fourth V-pits, and a second region disposed outside the first region of the fifth semiconductor layer,
wherein a thickness of the first region of the fifth semiconductor layer is 1 nm to 50 nm.

6. The semiconductor device according to claim 5, wherein the sixth semiconductor layer has a flat upper surface.

7. A semiconductor device package comprising:
a body;
a first lead electrode and a second lead electrode that are disposed on the body and are electrically separated from each other;
a semiconductor device electrically connected to the first lead electrode and the second lead electrode; and
a molding member surrounding the semiconductor device,
wherein the semiconductor device comprising:
a first semiconductor layer;
a second semiconductor layer disposed on the first semiconductor layer and comprising first V-pits;
an active layer disposed on the second semiconductor layer and comprising second V-pits disposed on the first V-pits;
a third semiconductor layer disposed on the active layer and comprising third V-pits disposed on the second V-pits;
a fourth semiconductor layer disposed on the third semiconductor layer and comprising fourth V-pits disposed on the third V-pits; and
a fifth semiconductor layer disposed on the fourth semiconductor layer and comprising fifth V-pits disposed on the fourth V-pits;
a sixth semiconductor layer disposed on the fifth semiconductor layer;
wherein the first and second semiconductor layers are an n-type semiconductor layer doped with an n-type dopant,
wherein the third and sixth semiconductor layers are a p-type semiconductor layer doped with a p-type dopant,
wherein the third semiconductor layer includes a bandgap wider than a bandgap of the active layer;
wherein the fourth semiconductor layer includes a bandgap lower than the bandgap of the third semiconductor layer,
wherein the fifth semiconductor layer includes a bandgap wider than the bandgaps of the third and fourth semiconductor layers,
wherein the active layer includes a first region disposed on the first V-pits, and a second region disposed outside the first region and the first V-pits,
wherein the second region of the active layer is disposed to be higher than the first region of the active layer,
wherein the third semiconductor layer includes a first region disposed on the second V-pits, and a second region disposed outside the first region of the third semiconductor layer and the second V-pits,
wherein the second region of the third semiconductor layer is disposed to be higher than the first region of the third semiconductor layer,
wherein a thickness of the first region of the third semiconductor layer is less than a thickness of the second region of the third semiconductor layer,
wherein the thickness of the first region of the third semiconductor layer is 1 nm to 50 nm,
wherein the third semiconductor layer and the fifth semiconductor layer comprise an aluminum composition,
wherein the sixth semiconductor layer has a bandgap equal to the bandgap of the fourth semiconductor layer,
wherein the active layer includes a first width which is a width of the second V-pits which is parallel to an upper portion of the active layer in a horizontal direction,
wherein the fifth semiconductor layer includes a second width which is a width of the fifth V-pits which is parallel to an upper portion of the fifth semiconductor layer in the horizontal direction,
wherein the second width is greater than the first width,
wherein the first width is 200 nm to 300 nm, and the second width is 300 nm to 400 nm,
wherein a width of each of the first to fifth V-pits is gradually increased in the direction from a top surface of the first semiconductor layer to a top surface of the sixth semiconductor layer,
wherein a lower vertex of each of the first to fifth V-pits is disposed between a bottom surface of the second semiconductor layer and a top surface of the second semiconductor layer.

* * * * *